(12) United States Patent
He et al.

(10) Patent No.: US 6,995,694 B1
(45) Date of Patent: ***Feb. 7, 2006

(54) METHODS, SOFTWARE, CIRCUITS AND SYSTEMS FOR CODING INFORMATION

(75) Inventors: Runsheng He, Sunnyvale, CA (US); Kok-Wui Cheong, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/157,233

(22) Filed: Jun. 20, 2005

Related U.S. Application Data

(63) Continuation of application No. 10/940,855, filed on Sep. 13, 2004.

(60) Provisional application No. 60/571,274, filed on May 14, 2004, provisional application No. 60/571,703, filed on May 17, 2004.

(51) Int. Cl.
*H03M 5/00* (2006.01)

(52) U.S. Cl. .............................. 341/58; 341/56; 341/57; 341/59; 375/219; 375/286; 375/287; 375/295; 375/298; 375/316

(58) Field of Classification Search ............ 341/56–59; 375/219, 286, 287, 292, 295, 298, 300, 316
See application file for complete search history.

(56) References Cited

U.S. PATENT DOCUMENTS

| | | | |
|---|---|---|---|
| 3,274,611 A * | 9/1966 | Brown et al. ................. | 360/40 |
| 3,518,662 A | 6/1970 | Nakagome et al. | |
| 3,521,274 A | 7/1970 | Sawai | |
| 3,611,141 A | 10/1971 | Waters | |
| 3,671,959 A | 6/1972 | Amano | |
| 4,020,282 A | 4/1977 | Halpern | |
| 4,910,750 A | 3/1990 | Fisher | |
| 5,166,956 A * | 11/1992 | Baltus et al. ............... | 375/286 |
| 5,191,330 A | 3/1993 | Fisher et al. | |
| 5,257,270 A | 10/1993 | Hilden et al. | |
| 5,633,631 A | 5/1997 | Teckman | |
| 5,784,409 A | 7/1998 | Coles | |
| 6,114,979 A | 9/2000 | Kim | |
| 6,377,640 B2 | 4/2002 | Trans | |
| 2001/0035994 A1 | 11/2001 | Agazzi et al. | |

OTHER PUBLICATIONS

John G. Proakis; Digital Communications, Fourth Edition; 2001 by The McGraw-Hill Companies, Inc.; New York; pp. 1-3, no month.

* cited by examiner

*Primary Examiner*—Peguy JeanPierre
*Assistant Examiner*—Khai M. Nguyen

(57) ABSTRACT

Methods, software, circuits, architectures, and systems for encoding, decoding and error checking/correcting information, particularly pulse amplitude modulated information. The present invention enjoys particular advantage when used to encode x-unit sequence values of N-ary information into y-unit sequence values of M-ary information and to decode y-unit sequence values of M-ary information into x-unit sequence values of N-ary information, where $N^x < M^y$ (and particularly where $N^x < M^y$, but $N^x > M^y - M$). The present invention advantageously provides a straight-forward mechanism for coding information that enables one to take advantage of coding overhead (e.g., unused states in the encoded, transmitted sequence) to accomplish other coding objectives, such as conforming to coding constraints, reducing transmission errors (or increasing the likelihood of successfully correcting such errors), dc balancing the coded information, and under certain conditions, even reducing power consumption.

32 Claims, 7 Drawing Sheets

FIG. 2
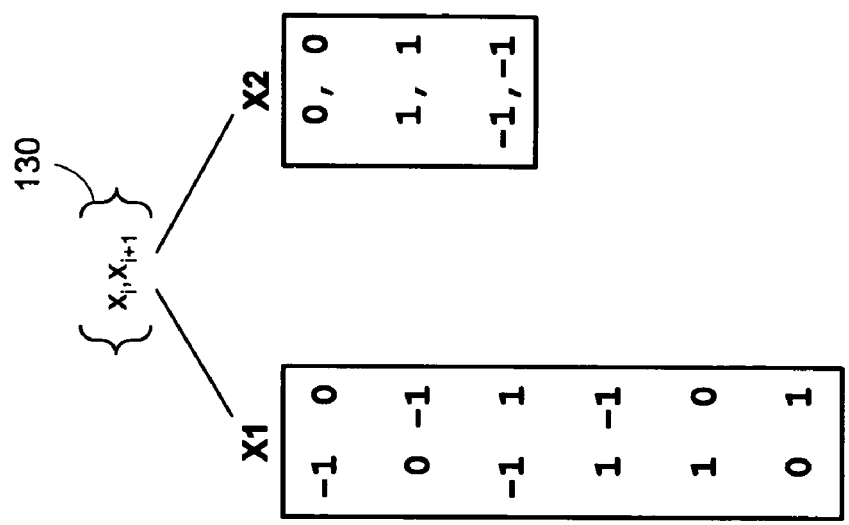
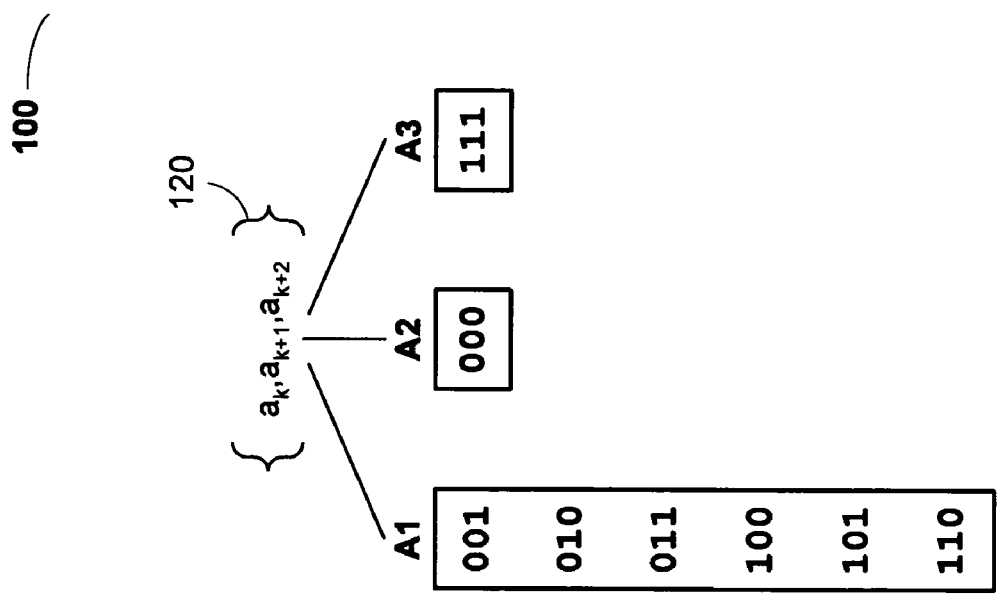

METHODS, SOFTWARE, CIRCUITS AND SYSTEMS FOR CODING INFORMATION

RELATED APPLICATIONS

This application is a continuation of U.S. application Ser. No. 10/940,855, filed Sep. 13, 2004, which claims the benefit of U.S. Provisional Application Nos. 60/571,274, filed May 14, 2004, and 60/571,703, filed May 17, 2004, each of which is incorporated herein by reference in their entireties.

FIELD OF THE INVENTION

The present invention generally relates to the field of information coding. More specifically, embodiments of the present invention pertain to circuits, architectures, systems, methods, algorithms and software for encoding, decoding and error checking information (e.g., amplitude modulated information).

SUMMARY OF THE INVENTION

Embodiments of the present invention relate to methods, algorithms, software, circuitry, architectures, and systems for encoding, decoding and error checking information. In one embodiment, the encoding method generally comprises the steps of (a) converting each of a first subset of unique x-unit N-ary sequence values into a corresponding one of a first plurality of unique y-unit M-ary sequence values, where x and y are each an integer, N and M are each an integer of at least 2, $M^y > N^x$, and each of the first plurality of unique y-unit M-ary sequence values is incapable of causing a violation of a coding constraint; and (b) converting each of a second subset of unique x-unit N-ary sequence values into (1) a first corresponding member of a second plurality of unique y-unit M-ary sequence values when the first corresponding member does not cause a coding constraint violation and (2) a second corresponding member of the second plurality of unique y-unit M-ary sequence values when the first corresponding member causes a coding constraint violation, wherein each of the unique y-unit M-ary sequence values in the second plurality is distinct from the unique ones of the first plurality. In a further, somewhat complementary aspect, the present invention relates to a method of decoding information comprising an M-ary sequence into an N-ary sequence, comprising the steps of (A) converting each of a first subset of unique y-unit M-ary sequence values into a corresponding unique x-unit N-ary sequence value; (B) determining a value for one or more previous y-unit M-ary sequences in response to a member of a second subset comprising one or more unique y-unit M-ary sequence values, each unique y-unit M-ary sequence value in the second subset being distinct from the unique y-unit M-ary sequence values in the first subset; and (C) converting each member of the second subset of unique y-unit M-ary sequence values into (i) a first one of a corresponding plurality of x-unit N-ary sequence values when the previous y-unit M-ary sequence value(s) have a first value and (ii) a second one of the corresponding plurality of x-unit N-ary sequence values when the immediately previous one of the corresponding plurality of x-unit N-ary sequence values when the previous y-unit M-ary sequence value(s) have a second value.

The encoding circuitry generally comprises (a) a detector configured to identify each of a plurality of x-unit sequence values of an N-ary sequence; (b) a converter configured to output a y-unit M-ary sequence value corresponding to the x-unit N-ary sequence value; and (c) coding constraint logic configured to (i) determine whether an M-ary sequence output from the converter conforms to a coding constraint for the M-ary sequence and (ii) instruct the converter to output (1) a member of a first subset of y-unit M-ary sequence values uniquely corresponding to the x-unit N-ary sequence value when the M-ary sequence conforms to the coding constraint and (2) a member of a second subset of y-unit M-ary sequence values when the M-ary sequence violates the coding constraint. As for the coding methods above, x and y are each an integer, N and M are each an integer of at least 2, $M^y > N^x$, and each of the y-unit M-ary sequence values in the first and second subsets are distinct from one another. However, the coding constraint logic is generally configured to instruct the converter to output a current member of the second subset of y-unit M-ary sequence values different from an nth previous member of the second subset.

The decoding circuitry generally comprises (I) a sequence value detector configured to identify each of a plurality of y-unit sequence values of the M-ary sequence, (II) a converter configured to output an x-unit N-ary sequence value uniquely corresponding to any one of a first subset of unique y-unit M-ary sequence values, and (III) coding constraint logic configured to (i) store a value for one or more previous y-unit M-ary sequences and (ii) instruct the converter to output one of a plurality of x-unit N-ary sequence values based on the previous y-unit M-ary sequence value(s) (or patterns thereof) when the sequence value detector identifies one of a second subset of unique y-unit M-ary sequence values. As for the other aspects of the invention described herein, x and y are each an integer, N and M are each an integer of at least 2, $M^y > N^x$, and each of the unique y-unit M-ary sequence values in the second subset is distinct from the unique sequence values of the first subset.

A further aspect of the invention relates to a parity encoding circuit that generally comprises (a) an encoder configured to convert each of a series of x-unit N-ary sequence values into a corresponding series of y-unit M-ary sequence values to form an M-ary sequence, and (b) a parity generator configured to add (i) an even parity indicator to the M-ary sequence when the M-ary information block has an even value and (ii) an odd parity indicator to the M-ary sequence when the M-ary information block has an odd value. A somewhat complementary aspect of the invention relates to a decoding circuit, generally comprising (A) a detector configured to determine a sequence value of an M-ary sequence; (B) a parity calculator configured to determine whether a parity indicator for the M-ary sequence is correct based on the sequence value of the M-ary sequence; (C) a converter configured to convert successive y-unit sequence values of the M-ary sequence into corresponding x-unit sequence values of an N-ary sequence; and (D) error correction circuitry configured to correct one or more least reliable M-ary bits or symbols (units) if the parity indicator is not correct.

The present software generally contains instructions adapted to perform or execute one or more of the inventive methods described herein, and the present architectures and/or systems generally comprise those that include a circuit embodying one or more of the inventive concepts disclosed herein. The present invention advantageously provides a straight-forward mechanism for coding information that enables one to take advantage of coding overhead (e.g., unused states in the encoded sequence) to accomplish other coding objectives, such as conforming to coding constraints, reducing transmission errors (or increasing the likelihood of successfully correcting such errors), dc balancing the coded information, and in some cases, possibly reducing power consumption.

These and other advantages of the present invention will become readily apparent from the detailed description of preferred embodiments below.

BRIEF DESCRIPTION OF THE DRAWINGS

FIG. 2 shows details of the exemplary encoding scheme of FIG. 1.

DETAILED DESCRIPTION OF THE PREFERRED EMBODIMENTS

Figure 1:
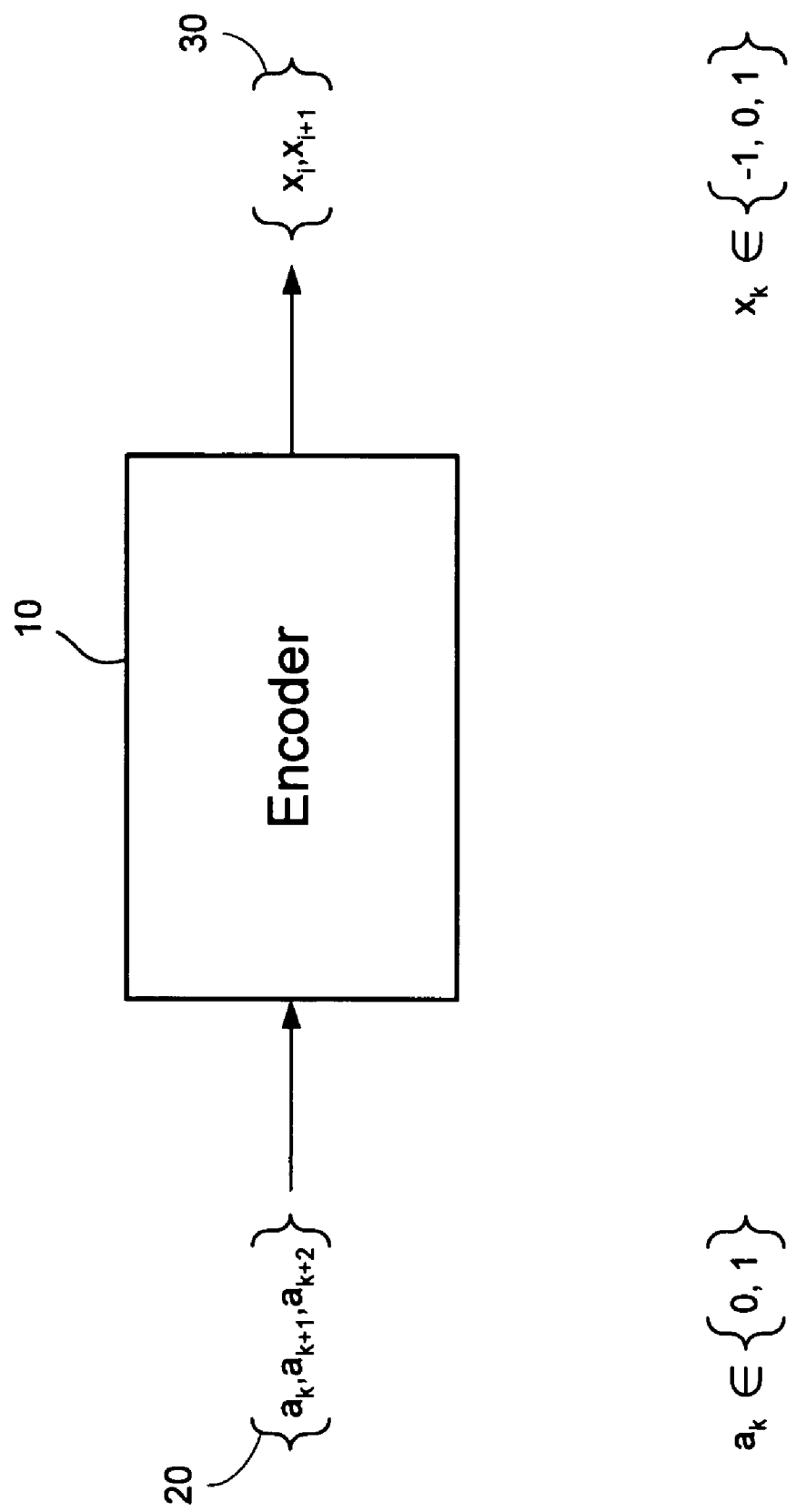
FIG. 1 is a diagram showing an exemplary encoding scheme in accordance with the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits or symbols, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, in the context of data bits and data symbols, the term "unit" generally refers to either a data bit or a data symbol, as those terms are understood in the art. In addition, the terms "subset" and "plurality" may also be used somewhat interchangeably herein (at least in the context of a subset that contains two or more elements or members), but these terms are generally given their ordinary meanings. Also, for convenience and simplicity, the terms "data," "data stream," "waveform" and "information" may be used interchangeably, as may the terms "connected to," "coupled with," "coupled to," and "in communication with," but these terms are also generally given their art-recognized meanings.

The present invention concerns a circuit, architecture, system, method, algorithm and software for coding y-unit M-ary information from x-unit N-ary information to conform with coding constraints on the M-ary information sequence that take advantage of coding overhead when $M^y > N^x$. The invention, in its various aspects, will be explained in greater detail below with regard to exemplary embodiments.

Exemplary Methods of Coding Amplitude Modulated Information

The present invention relates to methods of encoding and decoding information, as well as to methods for checking and/or correcting errors in such coded information. In one embodiment, the information comprises amplitude modulated information, such as pulse amplitude modulated (PAM) information or quadrature amplitude modulated (QAM) information. The information may comprise data, transmission information (e.g., identifying the source, a destination address, error checking and/or correction code, a data format, etc.), audio (voice) and/or video information, etc. Such information and/or data may comprise bits, symbols, and/or an analog waveform. The data may have a format such as a packet or frame (which format may comply with an art-recognized standard), and/or it may be organized in units and/or blocks, where a block may comprises an integer number of such units (e.g., a data unit generally has a predetermined number of bits or symbols, and a block generally has a predetermined length, but either a unit or a block may comprise one or more data bytes, words, sectors, lines, or other art-recognized data length).

In voice, data and/or video communications, coding schemes are often designed to ensure a minimum number of transitions in the encoded signal, generally for timing purposes (e.g., in order to ensure that the transmitted, encoded information signal [and, optionally, a clock pulse or signal] can be recovered). Thus, one typically designs such coding schemes so that there are sufficient transitions in the encoded data stream to satisfy coding constraints. For example, in one such constraint, the encoded data cannot include more than a certain, predetermined number of consecutive data units having the same value or state (hereinafter, such units may be termed "same value units"). Accordingly, in one embodiment of the present invention, the coding constraint comprises a maximum number of same value units. In this embodiment, it is generally advantageous if the coding scheme ensures that there is at least one transition (e.g., a change in value in consecutive units) every n y-unit units or every p units in the M-ary sequence.

FIG. 1 shows an encoder 10 adapted to convert a 3-bit sequence of binary data 20 into a 2-symbol sequence of ternary data 30. In one implementation, the invention encodes a conventional binary data stream (e.g., 8-state ASK data) into ternary pulse amplitude modulated (PAM3) data. Thus, in this implementation, N is 2, x is 3, M is 3, and y is 2, but the invention is equally applicable to other coding systems, as is discussed below. The present invention may be most easily understood with respect to certain examples described below, from which one may gain a better appreciation of general principles relating to the invention. However, the invention is not so limited, as is explained in greater detail herein below.

For example, by definition, there are M unique sequence values in the y-unit M-ary code that contain only same value units. Therefore, generally speaking, when $N^x \leq M^Y - M$, there are sufficient sequence values in the y-unit M-ary code to map each of the x-unit N-ary sequence values to a unique y-unit M-ary sequence value having a transition. This mapping approach ensures that there will be at least one transition every (2y–1) units in the M-ary sequence. As long as y is sufficiently small, an approach based on 1:1 mapping of x-unit N-ary sequence values to only y-unit M-ary sequence values having a transition ensures that the coding scheme works for coding constraints that place a relatively small number on the maximum number of consecutive same value units. For example, when y is 3, 1:1 mapping to only transition-containing values ensures at least one transition every 5 units (i.e., it works when the maximum number of same value units is 4 or more). When y is 2, 1:1 mapping to only transition-containing values ensures at least one transition every 3 units (i.e., it works when the maximum number of same value units is 2 or more).

However, there are coding schemes where $N^x < M^1$, but $N^x > M^y - M$, such as those shown in FIGS. 1–2 (i.e., where 3-bit binary data units are encoded as 2-unit ternary data units). In such cases, the number of values in the y-unit M-ary code is not sufficient to map each of the x-unit N-ary sequence values to a unique y-unit M-ary sequence value that has a transition therein. For example, referring to FIG. 2, the number of 3-bit binary values (i.e., the sum of the members of groups A1, A2 and A3) is greater than number of 2-unit ternary values having an internal transition (i.e., the number of members of group X1). As a result, a subset of x-unit N-ary sequence values must be mapped to y-unit M-ary sequence values that consist of only "same value" units (i.e., members of group X2). However, in such cases, repeated occurrences of an x-unit N-ary sequence value that maps to a y-unit M-ary sequence value consisting of same value units could result in an unacceptably long M-ary sequence of consecutive same value units (i.e., a constraint on consecutive same value units could be violated). The present invention provides a number of solutions for coding to sequence values having only same value units, without violating coding constraints on the maximum number of consecutive same value units.

A First Exemplary Method of Encoding Information

In one aspect, the present invention relates to a method of encoding information, generally comprising the steps of (a) converting each of a first subset of unique x-unit N-ary sequence values into a unique one of a first plurality of y-unit M-ary sequence values; and (b) converting a first one of a second subset of unique x-unit N-ary sequence values into a first member of a second plurality of unique y-unit M-ary sequence values. Generally, x, N, y, and M are each an integer of at least 2 (although x and/or y may also be 1), and $M^y > N^x$. Each of the first plurality of y-unit M-ary sequence values is incapable of causing a violation of a coding constraint, a characteristic that generally enables simple 1:1 mapping of the members of the first N-ary subset with the members of the first plurality of y-unit M-ary sequence values. By implication, the second plurality of y-unit M-ary sequence values contains sequence values that can cause a coding constraint violation (usually under certain predetermined conditions). As a result, each member of the second plurality of y-unit M-ary sequence values is generally distinct from the unique members of the first plurality of y-unit M-ary sequence values. However, one distinguishing feature of this exemplary encoding method is that the first member of the second plurality of M-ary sequence values is different from a second, immediately previous member of the second plurality of y-unit M-ary sequence values. In other words, after a first one of the members of the second plurality of M-ary sequence values is encoded, the next encoding of the first one of a second N-ary subset encodes a different one of the members of the second M-ary plurality. This exemplary encoding method will undoubtedly be easier to understand when explained with reference to a specific implementation, where x, N, y, and M are specifically defined.

FIG. 2 shows an embodiment 100 of the present coding scheme, using an example where 3-bit sequences of binary information 120 are converted to 2-unit sequences of ternary information 130. The coding scheme shown in FIG. 2 is one in which $N^x < MY$, but $N^x > MY - M$, so one must take steps to avoid violating a constraint on consecutive same value units that could result from repeated occurrences of an x-unit N-ary sequence value that maps to a y-unit M-ary sequence consisting of same value units.

In the first exemplary method, the eight possible unique 3-bit binary sequence values are segregated into a first subset A1 containing a plurality of unique values, a second "unique value" subset A2 and a third "unique value" subset A3. While each of second and third subsets A2 and A3 contains a single unique 3-bit binary value, one may alternatively segregate the $N^x$ possible values of information sequence values being encoded into two subsets (as is explained below with regard to a second exemplary encoding method). The nine possible 2-symbol ternary values are segregated into a first plurality X1 of unique values and a second plurality X2 of unique values, although one may similarly segregate the $N^x$ possible states of coded sequence values into three or more subsets (as is also explained below with regard to the second exemplary encoding method).

Generally, when 3-bit sequence of binary information 120 is an element (or member) of subset A1 (i.e., 001, 010, 011, 100, 101, or 110), then it maps to a unique 2-symbol sequence of ternary information (i.e., in a 1:1 correspondence) in ternary subset X1 (i.e., $\{-1,0\}$, $\{0,-1\}$, $\{-1,1\}$, $\{1,-1\}$, $\{1,0\}$, or $\{0,1\}$). Subsets $A^1$ and X1 are respectively the 3-bit binary and 2-symbol ternary sequence values that have an internal transition, but the "first subset" of possible unique values in this exemplary method is not limited to such a condition or requirement. However, since each member of group $X^1$ contains a transition, there is no need for special encoding steps to ensure that there is no violation of any constraint on the maximum number of same value units. Mathematically, when 3-bit binary data sequence value $\{a_k, a_{k+1}, a_{k+2}\}$ 120 $\in$ A1, then $\{x_i, x_{i+1}\}$ 130 $\in$ X1, and State(i)=State(i−1) (i.e., the current state of a state machine for an encoder encoding a member of subset A1 remains the same as that state machine was the previous time it encoded a member of subset X1, and 1:1 mapping between members of subsets A1 and X1 continues).

The exact 1:1 mapping of the individual elements in groups A1 and X1 is not critical to this embodiment, although one may map the elements of these subsets in a manner minimizing the number of bit changes in group A1 as one goes from a particular element (or member) of group X1 to its "nearest value" neighbor, a concept somewhat similar to Gray coding. In other words, in group X1, going from $\{1,-1\}$ to either $\{1,0\}$ or $\{0,-1\}$ results in only a single-bit change in the corresponding members of group A1 (e.g., 100 goes to either 101 or 110). Viewed from a different perspective, the members of group X1 (a first subset of y-unit M-ary sequence values) may be mapped to corresponding members of group A1 (a first subset of x-unit N-ary sequence values) in a manner maximizing the number of single-bit changes in 3-bit binary data sequence values that result from nearest value or nearest symbol changes in the 2-symbol ternary data sequence values. Such mapping may advantageously facilitate error checking and/or correction after one decodes the M-ary sequence.

On the other hand, when 3-bit sequence value of binary information 120 is an element (or member) of subset A2 (i.e., 000) or subset A3 (i.e., 111), then it may be converted to a 2-symbol sequence value of ternary information in subset X2 (i.e., $\{0,0\}$, $\{1,1\}$, or $\{-1,-1\}$) in a manner ensuring a relatively low maximum number of consecutive same value units in the encoded sequence. Although each member of subsets A2, A3 and X2 consists of same value units, it is not a requirement or condition of this method that subsets other than the first subset include only members consisting of same value units. In this exemplary method, however, repeated sequence values that consist of same value units (i.e., symbols or bits) can, at some number of repeated sequences, result in a "maximum consecutive same value" coding constraint violation. As a result, these values were selected for the inventive coding process(es) applied to the second subset of unique y-unit M-ary sequence values. Sequence values consisting of same value units were selected for the subsets of unique x-unit N-ary sequence values other than the first subset for compliance with maximum consecutive "same value" coding constraints, ease of coding and/or subsequent error checking and/or correction, as will become apparent to those skilled in the art.

Other "coding constrained" cases can be envisioned by those skilled in the art (e.g., disallowed states or sequences, certain coding techniques such as Hadamard codes, Golay codes, cyclic codes, BCH codes, convolutional codes, codes involving NRZ, NRZI or INRZI, etc.). Thus, in a general sense, those subsets containing one or more unique y-unit M-ary sequence values that, alone or upon repetition or combination with one or more other y-unit M-ary sequence values can result in a coding constraint violation, may be termed "coding constrained" subsets. Generally, each coding constraint will result in the formation of at least one "coding constrained" subset of unique sequence values.

In a first embodiment of this exemplary method, the conversion technique depends on whether 3-bit sequence value of binary information 120 is a member of a first type of subset (e.g., A3, the "second subset of x-unit N-ary sequence values" in this example) or a second type of subset (e.g., A2, which may be in the second N-ary subset or which may form a third subset, depending on implementation details). The first type of x-unit N-ary subset contains member(s) that have corresponding complementary members (i.e., unique sequence values) in a y-unit M-ary subset, and the second type of x-unit N-ary subset contains member(s) that do not or cannot have corresponding complementary members in a y-unit M-ary subset. In the case exemplified in FIG. 2, subset A3 (111) is the first type, as M-ary subset X2 contains two complementary members (e.g., $\{1,1\}$ and $\{-1,-1\}$) that correspond in a manner understandable to those skilled in the art to N-ary subset A3. Subset A2 (000) is the second type, as M-ary subset X2 contains only one remaining member $\{0,0\}$ after correlating complementary members $\{1,1\}$ and $\{-1,-1\}$ to subset A3. Thus, by virtue of the size of subset X2 and the previous mapping of $\{1,1\}$ and $\{-1,-1\}$ to subset A3, there cannot be a second member complementary to $\{0,0\}$ for mapping to subset A2. Also, in ternary logic employing logic values 1, 0 and −1, there is no logic value complementary to 0.

In the first case, the member(s) of the group A3 map to either of the two complementary members of subset X2, $\{1,1\}$ and $\{-1,-1\}$, such that the complement (or other) member of subset X2 is encoded relative to the most recently encoded member of subset X2. Mathematically, when 3-bit binary data sequence value $\{a_k, a_{k+1}, a_{k+2}\}$ 120=$\{1,1,1\}$, then $\{x_i, x_{i+1}\}$ 130=−State(i−1), State(i)=$\{x_i, x_{i+1}\}$ and State(i) $\in$ $\{[1,1], [-1,-1]\}$ (i.e., the state machine for an encoder encoding a member of subset A3 changes to the complement of its previous state and outputs the new state value as the encoded ternary symbol). In the exemplary embodiment of FIG. 2, "State" in the state machine changes (by negation) when encoding 111, and the output of the encoder for 111 is the value of the changed state. This embodiment is particularly advantageous for achieving a "zero mean" for the value(s) of the encoded/transmitted data.

Generally speaking, when $N^x < M^y - M$, the present encoding method may comprise converting one of the second subset of unique x-unit N-ary sequence values into one of a second plurality of unique y-unit M-ary sequence values different from an immediately previous one of the second plurality of y-unit M-ary sequence values. Each of the members in the second plurality of y-unit M-ary sequence values is typically distinct from the unique members of the first plurality of y-unit M-ary sequence values (for which 1:1 coding is applied). In certain embodiments, the second plurality of y-unit M-ary sequence values into which the member of the second subset of x-unit N-ary sequence value(s) (e.g., subset A3) consists of two members, and those two members may be complementary to one another. In such a case, sequence value $\{0,0\}$ in group X2 would form a separate (e.g., third) subset of unique y-unit M-ary sequence values.

Thus, upon the next occurrence of that one of the second subset of unique x-unit N-ary sequence values (as well as successive occurrences after the next occurrence), the method may further convert it into the complement of the immediately previous one of the second plurality of y-unit M-ary sequence values (i.e., the one of the second plurality of y-unit M-ary sequence values other than the immediately previous one). In addition, if none of the second subset of x-unit N-ary sequence values has been previously encoded, the exemplary method may convert the first such occurrence into any one of the second plurality of y-unit M-ary sequence values. In one implementation, when the first occurrence of the second subset of x-unit N-ary sequence values is 111, the encoded 2-symbol ternary sequence value is {1,1}. Referring back to the implementation of FIG. 2, when 3-bit binary sequence value 120 is a member of subset A2 (i.e., 000), then the exemplary encoding method comprises converting that sequence value into a remaining (unmapped) member of the second subset X2 (i.e., {0,0}) when the previously encoded y-unit M-ary sequence value in that second subset X2 does not equal the remaining (unmapped) member. When the previously encoded y-unit M-ary sequence value equals the remaining unmapped member (i.e., {0,0}), the exemplary encoding method converts the 3-bit binary sequence value 120 of subset A2 into the same member of subset X2 encoded by the immediately previous instance of a member of N-ary subset A3 (e.g., {1,1} or {−1,−1}, whichever was most recently encoded). Mathematically, the state machine for an encoder encoding a member of subset A2 does not change state when 3-bit binary data sequence value $\{a_k, a_{k+1}, a_{k+2}\}$ 120={0,0,0}. However, if $\{x_{i-2}, x_{i-1}\} \neq \{0,0\}$, then $\{x_i, x_{i+1}\}$ 130={0,0}; but if $\{x_{i-2}, x_{1-1}\} = \{0,0\}$, then $\{x_i, x_{i+1}\}$ 130=State(i−1), where State(i)=$\{x_i, x_{i+1}\}$ and State(i)∈{[1,1], [−1,−1]}. In other words, if the previously encoded M-ary sequence value $\{x_{i-2}, x_{i-1}\}$ was a sequence value other than {0,0}, and the encoder encodes the remaining member of the second M-ary subset {0,0}; but if the previously encoded M-ary sequence value $\{x_{i-2}, x_{i-1}\}$ was {0,0}, the encoder encodes the previous instance of the state.

Thus, in a further embodiment, the exemplary method further comprises the steps of: (c) converting a second one of the second subset of unique x-unit N-ary sequence values into a third member in the second plurality of unique y-unit M-ary sequence values as long as at least one of n preceding y-unit M-ary sequence values in the M-ary sequence differs from the third member, n being as defined above (and in this embodiment, n is a number defined at least in part by the coding constraint); and (d) if none of the n preceding y-unit M-ary sequence values in the M-ary sequence differ from the third member, converting the second one of the second subset of x-unit N-ary sequence values into one of the first and second members. In one implementation, after an occurrence of the first member of the second subset of x-unit N-ary sequence values, the second one of the second subset of x-unit N-ary sequence values is converted into the immediately previous member of the second plurality of y-unit M-ary sequence values (i.e., the encoded M-ary sequence value has the same value as the most recent y-unit M-ary sequence value encoded from the second subset of N-ary sequence values). In these embodiments, the second plurality of y-unit M-ary sequence values may consist of the first, second and third members. In the example of FIG. 2, group A2 (binary sequence value 000) is the second one of the second subset of unique x-unit N-ary sequence values.

In some instances, the length of the information sequence to be encoded divided by x (as defined above) may not be an integer. For example, when the binary data sequence to be broken into 3-bit sequence values and coded into PAM3 information is 4000 bits long, one bit will remain to be encoded (a "remainder") after all 3-bit sequence values are encoded. One technique for encoding such a remainder is to append a sufficient number of binary zero bits to form a final 3-bit sequence value that can be mapped to a corresponding PAM3 symbol (e.g., to ensure that the number of units in the N-ary sequence values divided by x is an integer). Another technique involves mapping the remainder to a corresponding PAM3 symbol such that the PAM3 symbol meets one or more coding criteria, and determining the binary bit values to append to the remainder to meet the criteria. Examples of such coding criteria include achieving a dc balanced sequence, mapping to a symbol with the least number of nearest neighbors, etc. In such cases, the decoder decodes as usual, and the number of binary bits to be regarded as data (e.g., 4000 in the example in this paragraph) may be embedded in the beginning of the packet containing the encoded information/data.

Table 1 below contains a number of examples showing how the exemplary coding method encodes 3-bit binary data (where "xxx" is a 3-bit binary sequence value having an internal transition) into 2-symbol ternary data (where "y,y" is a 2-symbol ternary sequence value having an internal transition) such that the maximum number of consecutive same value units is 4 (i.e., there is at least one transition every 5 units):

TABLE 1

Binary to ternary mapping

| Binary Code | Ternary Code | Worst case |
|---|---|---|
| 111111111 | 1,1,−1,−1,1,1 | — |
| 111xxx111xxx111 | 1,1,y,y,−1,−1,y,y,1,1 | 1,1,1,−1,−1,−1,−1,1,1,1 |
| 111000000000 | 1,1,0,0,1,1,0,0 | — |
| 111111000000 | 1,1,−1,−1,0,0,−1,−1 | — |
| 111000111000 | 1,1,0,0,−1,−1,0,0 | — |
| 111000000111 | 1,1,0,0,1,1,−1,−1 | — |
| 000000xxx000 | 0,0,1,1,y,y,0,0 | 0,0,1,1,1,1,0,0,0 |
| 000111000111 | 0,0,1,1,0,0,−1,−1 | — |
| 000111000000 | 0,0,1,1,0,0,−1,−1 | — |
| 000000111111 | 0,0,1,1,−1,−1,1,1 | — |
| 000xxx111xxx000 | 0,0,y,y,1,1,y,y,0,0 | 0,0,0,1,1,1,1,0,0,0 |
| 111xxx000xxx111 | 1,1,y,y,0,0,y,y,−1,−1 | 1,1,1,0,0,0,0,−1,−1,−1 |

A First Exemplary Method of Decoding Information

In a further aspect, the present invention relates to a method of decoding information comprising an M-ary sequence (typically into an N-ary information sequence), the method comprising the steps of (1) converting each of a first subset of y-unit M-ary sequence values into a corresponding x-unit N-ary sequence value; (2) converting each of a plurality of members of a second subset of unique y-unit M-ary sequence values into a first one of a corresponding plurality of x-unit N-ary sequence values when an immediately previous one of the corresponding plurality of y-unit M-ary sequence values has a different value; and (3) converting each of the plurality of members of the second subset of unique y-unit M-ary sequence values into a second one of the corresponding plurality of x-unit N-ary sequence values when the immediately previous one of the corresponding plurality of x-unit N-ary sequence values has a same value. Generally, x, N, y, and M are each an integer of at least 2 (although x and/or y may also be 1), and $M^y > N^x$. The first subset of y-unit M-ary sequence values comprises a plurality of unique sequence values (out of the complete set of possible unique y-unit M-ary sequence values), and each of the unique sequence values corresponds to a unique N-ary x-unit sequence value (out of the set of all possible unique x-unit N-ary sequence values). In addition, each of the sequence values in the second subset of y-unit M-ary sequence values is distinct from the unique y-unit M-ary sequence values in the first subset.

In various embodiments, the information comprises amplitude modulated information, particularly pulse amplitude modulated information. This exemplary decoding method will be explained with reference to a specific implementation, where y is 2, M is 3, N is 2 and x is 3 (e.g., where $N^x > M^y - M$), as for the implementation in the first exemplary encoding method above.

Generally, when the 2-symbol sequence value of ternary information is an element (or member) of subset X1 (i.e., $\{-1,0\}$, $\{0,-1\}$, $\{-1,1\}$, $\{1,-1\}$, $\{1,0\}$, or $\{0,1\}$), then it maps to a unique 3-bit sequence value of binary information in subset A1 (i.e., 001, 010, 011, 100, 101, or 110). Mathematically, when 2-symbol ternary data sequence value $\{x_i, x_{i+1}\} \in X1$, then $\{a_k, a_{k+1}, a_{k+2}\} \in A1$, and State(i)=State(i−1) (i.e., the current state of a state machine for an decoder decoding a member of subset X1 remains the same as that state machine was the previous time it decoded a member of subset X1, and 1:1 mapping between members of subsets X1 and A1 continues). Thus, in one embodiment of the exemplary decoding method, each of the first subset of unique y-unit M-ary sequence values includes a transition.

However, when the 2-symbol ternary sequence value is $\{1,1\}$ or $\{-1,-1\}$ (e.g., members of a second subset of y-unit M-ary sequence values that may be complementary and/or that consist of "same value" units), then it maps to one of the 3-bit binary sequence values 111 (subset A3 in FIG. 2) or 000 (subset A2), depending on the value of the immediately previous occurrence of either 2-symbol ternary sequence value $\{1,1\}$ or $\{-1,-1\}$. If the complementary "same value" M-ary sequence being decoded is the same as the immediately previous complementary "same value" M-ary sequence, then the M-ary sequence value being decoded is converted to 000 (subset A2). If the complementary "same value" M-ary sequence being decoded is the complement of (or different from) the immediately previous complementary "same value" M-ary sequence, then the M-ary sequence value being decoded is converted to 111 (subset A3). Mathematically, when $\{x_i, x_{i+1}\} \pm \{1,1\}$, if $\{x_i, x_{i+1}\} = -\text{State}(i-1)$, then $\{a_k, a_{k+1}, a_{k+2}\} = 111$; and if $\{x_i, x_{i+1}\} = \text{State}(i-1)$, then $\{a_k, a_{k+1}, a_{k+2}\} = 000$; in both cases, State(i)=$\{x_i, x_{i+1}\}$, where $\{x_i, x_{i+1}\} \in \{[1,1], [-1,-1]\}$.

Thus, in various embodiments of the exemplary decoding method, each of the plurality of members of the second subset of unique y-unit M-ary sequence values can be converted into only one of the first one or the second one of the second plurality of x-unit N-ary sequence values. Furthermore, the first and second ones of the second plurality of x-unit N-ary sequence values may be complementary, and on a subsequent occurrence of one of the second subset of y-unit M-ary sequence values, the method may further comprise converting the one of the second subset of y-unit M-ary sequence values into the first or second one of the second plurality of x-unit N-ary sequence values complementary to the immediately previous one of the second plurality of x-unit N-ary sequence values. In even further embodiments, each of either or both of (i) the second subset of y-unit M-ary sequence values and/or (ii) the second plurality of x-unit N-ary sequence values may consist of same value units.

When the 2-symbol ternary sequence value is $\{0,0\}$, then (somewhat similarly to y-unit sequence values in group X1), it maps to the 3-bit binary sequence value 000 (subset A2 in FIG. 2) every time. Mathematically, it is essentially the same as for decoding a member of subset X1 (i.e., when $\{x_i, x_{i+1}, \}=\{0,0\}$, then $\{a_k, a_{k+1}, a_{k+2}\} \in A2$, which only has one member, 000), in that State(i)=State(i−1). Thus, in a further embodiment, the exemplary decoding method further comprises the step of converting a member of a third subset containing one or more unique y-unit M-ary sequence values into a predetermined one of the second plurality of x-unit N-ary sequence values.

However, as described above, mapping between the 2-symbol ternary sequence value $\{0,0\}$ and the 3-bit binary sequence value 000 is not uniquely 1:1, in that three different 2-symbol ternary sequence values can be decoded to the 3-bit binary sequence value 000, leading to various possible implementations in the exemplary decoding method. For example, similar to the remaining and/or unmapped member of the second subset X2 in the exemplary encoding method described above, the third subset of y-unit M-ary sequence values may consist of a single member, and the predetermined one of the second plurality of x-unit N-ary sequence values may be one of (or selected from) the first and second ones of the second plurality of x-unit N-ary sequence values.

A Second Exemplary Method of Encoding Information

A further aspect of the present invention relates to a method of encoding information, comprising the steps of (A) converting each x-unit sequence value of an N-ary sequence into a corresponding y-unit sequence value of an M-ary sequence as long as the M-ary sequence conforms to one or more coding constraints therefor, where x, N, y, and M are each an integer of at least 2 (although x and/or y may also be 1), and $M^y > N^x$; and (B) when converting one of the x-unit N-ary sequence values violates at least one of the one or more coding constraints, converting the one x-unit N-ary sequence value into an unmapped y-unit M-ary sequence value that results in the M-ary sequence conforming to the at least one of the one or more coding constraints. In this exemplary method, the second member in the second subset of M-ary sequence values is an unmapped sequence value.

Typically, each unique x-unit N-ary sequence value (of the $N^x$ possible unique x-unit N-ary sequence values) corresponds (or is mapped) to a unique y-unit M-ary sequence value (i.e., a 1:1 mapping correspondence), and the remaining, unmapped y-unit M-ary sequence values are used to indicate coding constraint violations and, optionally, to disallow certain states for the y-unit M-ary sequence values (e.g., in the recovered M-ary information). In this context, a disallowed M-ary state (e.g., a predetermined value for an M-ary sequence generally consisting of a predetermined number of units not necessarily equal to y) can be considered a type of coding constraint violation. However, certain N-ary sequence values may cause a coding constraint violation or a disallowed state in the coded M-ary sequence. Such N-ary sequence values are grouped in the second subset of unique N-ary sequence values, and one or more special coding steps may be taken (e.g., under certain circumstances or conditions) to indicate that such a coding constraint violation or disallowed state would have occurred but for the special coding. This exemplary encoding method may also be best understood when explained with reference to a specific implementation, where x, N, y, and M are each specifically defined (for example, where N=2, x=3, M=3, and y=2, as for the first exemplary encoding method described above).

The eight states available in 3-bit digital PAM (or ASK) information can be mapped into 2-symbol ternary space according to Table 2 below:

TABLE 2

Binary to ternary mapping

| Binary | Ternary |
|--------|---------|
| 000 | 0,0 |
| 001 | −1,0 |
| 010 | 1,0 |
| 011 | −1,1 |
| 100 | 0,−1 |
| 101 | −1,−1 |
| 110 | 1,1 |
| 111 | 0,1 |

While any scheme that maps each unique x-unit N-ary value (or symbol) to a unique y-unit M-ary value (or symbol) is suitable, the mapping scheme of Table 1 is advantageous because it maximizes the number of adjacent ternary values that correspond to single bit binary errors, similar to Gray coding. In the example of Table 1 above, all of the "nearest symbol" errors in ternary space correspond to single bit errors in binary space, except for {0,0}↔{0,1}, which corresponds to a 3-bit error (i.e., 000↔111). Thus, in one embodiment of the present mapping scheme, a majority of nearest symbol or nearest value changes in the y-unit M-ary sequence values correspond to single-unit changes in the x-unit N-ary sequence values; in a more preferred embodiment, a maximum number of nearest symbol changes in the y-unit M-ary sequence values correspond to single-unit changes in the x-unit N-ary sequence values.

As explained above, in one embodiment of the present method, the coding constraint not to be violated comprises a maximum number of same value units (e.g., repeated instances or occurrences of {0,0}, {1,1} or {−1,−1} in the 2-symbol ternary encoded information described above). In this embodiment, it is generally advantageous if the unmapped y-unit M-ary sequence value contains a transition. For example, no 3-bit binary sequence value is mapped to the 2-symbol ternary sequence value {1,−1} in Table 2 above, and the unmapped 2-symbol ternary sequence value {1,−1} contains a transition therein. In various implementations, the maximum number of same value units may be defined by a maximum number of consecutive or repeated y-unit sequence values having same value units (i.e., n*y, where n is a positive integer of at least 2, such as 2, 3, 4, 5, 6, etc., consistent with the above description[s] of n). In one implementation, n is 2.

For example, when n is 2, an encoded sequence such as 0,0 0,0 0,0 0,0 would have the third "0,0" sequence value replaced by 1,−1 as follows: 0,0 0,0 1,−1 0,0. Likewise, a sequence that would otherwise be encoded as 0,1 1,1 1,1 1,1 would have the third "1,1" sequence value replaced by 1,−1 as follows: 0,1 1,1 1,1 1,−1. This approach ensures that there are no more than ((y*[n+1])−1)=5 consecutive "same value" symbols when the value of the "same value" symbols differs from the value of the first symbol in the unmapped sequence, and no more than ((y*[n+2])−2)=6 consecutive "same value" symbols when the value of the "same value" symbols is the same as the value of the first symbol in the unmapped sequence (i.e., there is at least 1 transition every [(y[n+2]) −1], or 7 symbols in this case). In one example of the worst case for consecutive "same value" units, +/−1,0 0,0 0,0 0,+/−1 would not have any 2-symbol ternary sequence values or symbols replaced by an unmapped sequence value or symbol. However, any sequence having a greater number of same value units (e.g., 0,0 0,0 0,0 0,+/−1 or +/−1,0 0,0 0,0 0,0) would have the third consecutive 0,0 sequence value replaced with 1,−1.

A Second Exemplary Method of Decoding Information

In a further aspect, the present invention relates to a method of decoding information, the method comprising the steps of (I) replacing an unmapped sequence value in an M-ary sequence with a mapped y-unit M-ary sequence value corresponding to (or that results in) a coding constraint violation; and (II) converting the mapped sequence values into corresponding x-unit N-ary sequence values to produce an N-ary sequence (such that $M^y > N^x$). In this aspect of the invention, the M-ary information comprises an M-ary sequence of y-unit mapped sequence values and at least one y-unit unmapped sequence value, where each unique mapped sequence value corresponds to a unique x-unit N-ary sequence value, and the y-unit unmapped sequence value(s) indicates a coding constraint violation in the M-ary information/sequence.

This exemplary decoding method is somewhat complementary to the second exemplary encoding method described above, in that this exemplary decoding method is generally designed to decode information that has been encoded by one or more embodiments of the second exemplary encoding method described above. This second exemplary decoding method will also be explained with reference to a specific implementation, where N=2, x=3, M=3, and y=2, as for the first and second exemplary encoding methods and the first exemplary decoding method described above. Thus, as for those methods, in various implementations, N is 2, x and M are each independently at least 3 (and in certain implementations, x is 3, M is 3 and y is 2), the information comprises amplitude modulated information (e.g., pulse amplitude modulated information), and the coding constraint comprises a maximum number of consecutive same value units. Also, a majority (e.g., a maximum number) of nearest value changes in the y-unit M-ary sequence values may correspond to nearest symbol or single-unit changes in the x-unit N-ary sequence values (e.g., when N is 2, nearest value changes in the y-unit M-ary sequence values may correspond to single-bit changes in the binary sequence values). Referring to Table 2 above, one will recall that the unique 2-symbol ternary value {1,−1} is unmapped. When the decoder encounters the unmapped 2-symbol ternary value, it is an indication of a coding constraint violation (in this case, the maximum number of consecutive or repeated sequence values consisting of same value units has been exceeded) and that the unmapped 2-symbol sequence value should be replaced. Thus, where each of the unmapped y-unit M-ary sequence values contains a transition, the unmapped sequence value(s) may indicate that the corresponding mapped sequence value would have caused a coding constraint violation in the M-ary sequence, had it not been replaced with the unmapped sequence value. Also, where the coding constraint comprises a maximum number of consecutive sequence values consisting of same value units, the maximum number may be n, where n is an integer of at least 2 (corresponding to a maximum number of consecutive same value units of [(y*[n+2])−2]).

When replacing an unmapped sequence value, the decoder looks at the previous n sequence values, then replaces the replaces the unmapped sequence value with the mapped y-unit M-ary sequence value that would have violated the coding constraint. Thus, the exemplary method may further comprise identifying (e.g., determining the value or identity of) an nth previous y-unit M-ary sequence value. In one example where the coding constraint is a maximum consecutive number of same value units, the unmapped sequence value is replaced with a mapped sequence value having the same value as any one of the n previous y-unit M-ary sequence values. Where the coding constraint is something other than a maximum consecutive number of same value units (or sequence values consisting of same value units), the unmapped sequence value may replaced with a mapped sequence value from a look-up table having an x-unit N-ary value stored therein at an address that corresponds to a particular coding constraint violation.

There is a somewhat unexpected benefit to this second decoding method in the area of error checking and/or correction. As those skilled in the art understand, one may, on occasion, receive an M-ary sequence that includes a "false" unmapped sequence value (i.e., an unmapped sequence value in a received M-ary sequence does not correspond to a coding constraint violation). In such a case, one may look at the n previous M-ary sequence values and perform an error correction appropriate for the values of those n previous M-ary sequence values. In all such cases, however, the method further comprises identifying (e.g., determining the value or identity of) each of the n previous y-unit M-ary sequence values, and may further comprise identifying or determining a most unreliable bit or symbol (in accordance with techniques known to those skilled in the art) and/or identifying or determining the remaining units or sequence value(s) (i.e., those units or sequence values other than the most unreliable unit or the sequence value containing a most unreliable unit; hereinafter a "remaining unit value"). Generally, if the method determines a most unreliable unit, the method will also determine the values of the remaining units and/or sequence(s) (if any).

For example, if more than one unit in the n previous y-unit M-ary sequence values has a value other than that of the remaining units, the method may further comprise changing the most unreliable unit in the unmapped sequence value. However, if exactly one unit in the n previous y-unit M-ary sequence values has a value other than that of the remaining units, the method may further comprise changing a most unreliable unit in one or both of the unmapped sequence value and the exactly one unit.

In this latter embodiment, if the most unreliable unit is known with reasonable certainty (e.g., the most unreliable unit in the unmapped sequence value has a reliability factor of 0.8 and the exactly one unit has a reliability factor of 0.2), one may correct only the most unreliable unit of the two. However, it may not always be possible to determine a single "most unreliable unit" with reasonable certainty (e.g., the most unreliable unit in the unmapped sequence value and the exactly one unit both have a reliability factor of 0.5). In such a case, one may arbitrarily select the most unreliable unit of the unmapped sequence value or the exactly one unit for correction. Afterwards, one may calculate a parity value for the decoded sequence, and compare the calculated parity value with a parity value transmitted with the encoded sequence. If the two parity values match, one may be reasonably confident that error correction was performed successfully. If the two parity values do not match, the other unit may be corrected, and the parity value for the corrected decoded sequence recalculated and compared with the transmitted parity value. If the two parity values still do not match, both units may be corrected, and the parity value for the doubly-corrected decoded sequence recalculated and compared with the transmitted parity value. If the two parity values still do not match, one may either (i) sequentially correct each unit in the n previous y-unit sequences, or (ii) request a retransmission of the encoded information.

Thus, as a result of the second coding method, one can take somewhat targeted and/or precise error correcting actions if one detects an error (e.g., a false unmapped sequence value) in the received encoded information. Naturally, the probability of finding (and thus correcting) such errors increase with the value of n.

An Exemplary Method of Encoding Parity Information

In a further aspect, the present method further comprises adding a parity indicator to the M-ary sequence. Thus, the present invention further relates to a method of encoding amplitude modulated information, comprising the steps of (1) converting each of a series of x-unit sequence values of an N-ary sequence into a corresponding series of y-unit sequence values of an M-ary sequence to create an M-ary information block, where $M^y > N^x$; (2) adding an even parity indicator to the M-ary sequence when the M-ary information block has an even value; and (3) adding an odd parity indicator to the M-ary sequence when the M-ary information block has an odd value.

Figure 3:
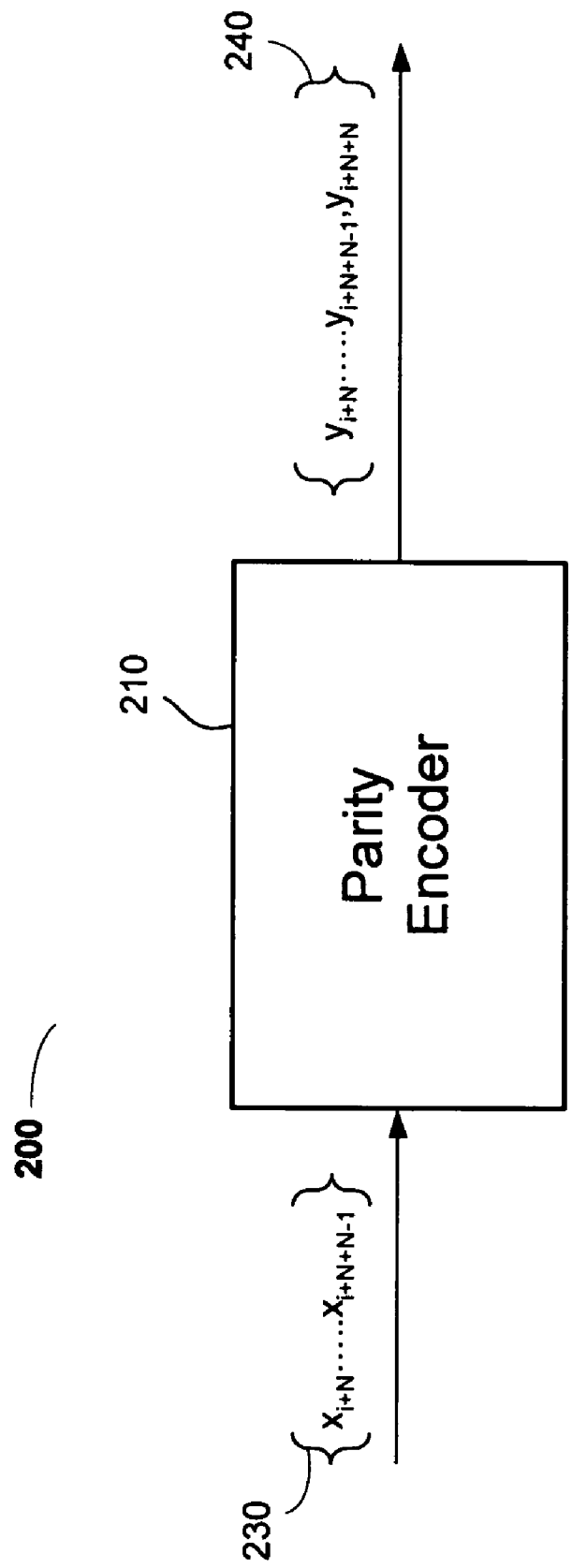
FIG. 3 is a diagram showing an exemplary parity encoding scheme in accordance with the present invention.

FIG. 3 shows an exemplary parity encoding scheme 200, in which parity encoder 210 adds parity information (typically in the form of a parity indicator) to encoded information 230 to generate parity-encoded information 240. This aspect of the invention may be most easily understood with respect to an exemplary implementation similar to the exemplary methods described above. Thus, in this exemplary method of encoding parity information, x and M may be an integer of at least 3 (in one embodiment, x=M=3), and/or N and y may be 2 (in one embodiment, N is 2, x is 3, M is 3, and y is 2). However, this aspect of the present invention is not limited to the exemplary implementation, as will be explained in greater detail where it is convenient and/or appropriate to do so.

Parity encoder 210 receives encoded M-ary information sequence $\{x_i, x_{i+1} \ldots x_{i+N}, x_{i+N+1}, \ldots x_{i+N+N-1}\}$ 230 and outputs parity encoded information sequence $\{y_i, y_{i+1} \ldots y_{i+N}, y_{i+N+1}, \ldots y_{i+N+N-1}, y_{i+N+N}\}$ 240. In essence, parity encoded information sequence $\{y_i, y_{i+1} \ldots y_{i+N}, y_{i+N+1}, \ldots y_{i+N+N-1}, y_{i+N+N}\}$ 240 is the same as encoded M-ary information sequence $\{x_i, x_{i+1} \ldots x_{i+N}, x_{i+N+1}, \ldots x_{i+N+N-1}\}$ 230, but with parity indicator $y_{i+N+N}$ (e.g., a parity bit) appended thereto. In one embodiment, parity encoder 210 performs a mathematical operation to determine whether the M-ary information block has the even value or the odd value. Such mathematical operations for determining even or odd value are well known to those skilled in the art.

Mathematically, $x_i = y_i$, $x_{i+1} = y_{i+1} \ldots x_{i+N} = y_{i+N}$, $x_{i+N+1} = y_{i+N+1}, \ldots$ and $x_{i+N+N-1} = Y_{i+N+N-1}$, and $Y_{i+N+N} =$ an even bit (e.g., 0) if $\{X_i, X_{i+1} \ldots x_{i+N}, X_{i+N+1}, \ldots X_{i+N+N-1}\}$ 230 has an even value (e.g., is an even number), but $Y_{i+N+N} =$ an odd bit (e.g., 1) if $\{X_i, X_{i+1} \ldots X_{i+N}, X_{i+N+1}, \ldots X_{i+N+N-1}\}$ 230 has an odd value (e.g., is an odd number). Thus, in the present method, the step of adding may comprise adding an even parity indicator to the M-ary sequence when the M-ary information block has an even value, and/or adding an odd parity indicator to the M-ary sequence when the M-ary information block has an odd value. In certain implementations, the even parity indicator consists of a parity bit having an even value (e.g., an even parity bit), and the odd parity indicator consists of a parity bit having an odd value (e.g., an odd parity bit).

An Exemplary Method of Decoding Parity-encoded Information

In a further aspect, the present invention relates to a method of decoding parity-encoded information, comprising the steps of (a) determining a value of the information, the information comprising an M-ary sequence; (b) determining whether a parity indicator for the information is correct based on the value of the information; (c) decoding successive y-unit blocks of the M-ary sequence into x-unit blocks of an N-ary sequence; and (d) if the parity indicator is not correct, correcting one or more least reliable M-ary units.

The exemplary method of decoding parity-encoded information is intended to decode information that has been parity-encoded by the exemplary method of encoding parity information described above. Thus, x and M may be an integer of at least 3 (in one embodiment, x=M=3), and/or N and y may be 2 (in one embodiment, N is 2, x is 3, M is 3, and y is 2). Furthermore, as described above, the information may comprise amplitude modulated information (e.g., pulse amplitude modulated information). As a result, the method may further comprise receiving an analog waveform containing the parity-encoded information, and the value of the information may be determined at least in part by sampling the analog waveform and comparing the sampled analog waveform to a plurality of predetermined threshold values.

Figure 4:
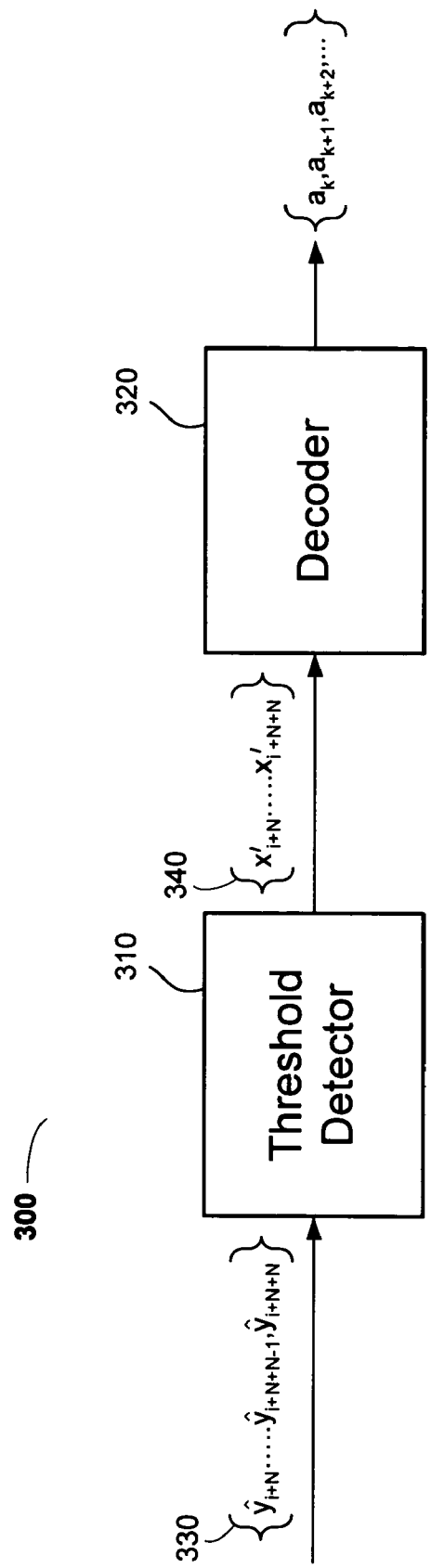
FIG. 4 is a diagram showing an exemplary decoding and error checking scheme in accordance with the present invention.

FIG. 4 shows a decoding scheme 300, in which threshold detector 310 receives parity encoded information sequence $\{\hat{y}_i, \hat{y}_{i+1} \ldots \hat{y}_{i+N}, \hat{y}_{i+N+1} \ldots \hat{y}_{i+N+N-1}, \hat{y}_{i+N+N}\}$ 330 and outputs quantized (or digitized) information sequence $\{x'_i, x'_{i+}, \ldots x'_{i+N}, x'_{i+N+1}, \ldots x'_{i+N+N-1}, x'_{i+N+N}\}$ 340. In this case, since parity encoded information sequence $\{\hat{y}_i, \hat{y}_{i+1} \ldots \hat{y}_{i+N}, \hat{y}_{i+N+1} \ldots \hat{y}_{i+N+N-1}, \hat{y}_{i+N+N}\}$ 330 has been transmitted over a channel, each bit or symbol in the sequence may have been modified during transmission; mathematically, for example, $\hat{y}_i = y_i + $ noise (i.e., $y_i = y_i$ of parity encoded information sequence 240 in FIG. 3), and $x'_i = \hat{y}_i$ after its M-ary value has been determined.

In the exemplary method, when M is 3, the ternary symbols generally have a value of 1, 0 or −1, and the predetermined threshold values may comprise or consist of a first threshold value (e.g., of from 0.15 to 0.85, 0.25 to 0.75, or 0.35 to 0.65; in one embodiment, the threshold value is about 0.5) and a second threshold value (e.g., of from −0.85 to −0.15, −0.75 to −0.25, or −0.65 to −0.35; in one embodiment, the threshold value is about −0.5). In this example, when the sampled analog waveform has a value greater than the first threshold value, the symbol has a value of 1; when the sampled analog waveform has a value less than the second threshold value, the symbol has a value of −1; and when the sampled analog waveform has a value between the first and second threshold values, the symbol has a value of 0.

Decoder 320 receives M-ary sequence $\{x'_i, x'_{i+1} \ldots x'_{i+N}, x'_{i+N+1}, \ldots x'_{i+N+N-1}, x'_{i+N+N}\}$ 340 and decodes it (generally according to one of the above-described exemplary methods of decoding information) to produce N-ary sequence $\{a_k, a_{k+1}, a_{k+2}, \ldots\}$. However, decoder 320 also determines a parity value for M-ary sequence 340 (e.g., by calculating it from sequence 340, or performing a mathematical operation on M-ary sequence 340 to determine it in accordance with the exemplary method of parity-encoding information described above), and compares the determined/calculated parity value to bit $X'_{i+N+N}$. If they are not the same, the method may further comprise correcting or changing the values of the least reliable samples (e.g., bits or symbols in M-ary sequence 340), generally to a nearest value. In the case where M=3 and the least reliable bit has a value of 0, if the analog value of the least reliable bit is positive (i.e., >0), it is changed to 1; and if the analog value of the least reliable bit is negative (i.e., <0), it is changed to −1. If the determined/calculated parity and bit $x'_{i+N+N}$ have the same value (e.g., even or odd), one may presume that there are no errors in the received M-ary sequence 340.

Variations on the Exemplary Methods

The present invention is not limited to binary-to-ternary encoding and decoding, and it is applicable to other coding systems, as long as $M^y > N^x$ (particularly when M>N). For example, one may encode 5-bit binary sequence values (32 possible states or unique bit combinations) into 2-symbol PAM6 sequence values (36 possible states or unique symbol combinations), or 2-symbol 5-ary sequence values (25 possible states or unique symbol combinations) into 3-bit PAM3 sequence values (27 possible states or unique symbol combinations). Similarly, the invention is applicable to coding 4-bit binary sequence values (16 possible states or unique symbol combinations) into 2-symbol PAM5 sequence values (25 possible states or unique symbol combinations). In this latter case, about a third of the PAM5 coding space appears to be overhead (i.e., symbols that are not used for direct symbol-to-symbol coding).

However, one may advantageously use this M-ary overhead to indicate various coding violations, to detect and/or correct errors, and/or to shape the encoded information waveform in a manner less conducive to causing errors or more conducive to reducing or minimizing power consumption (e.g., by dc balancing the coded information). For example, in the case where 4-bit binary sequence values are encoded into 2-symbol PAM5 sequence values, one may wish to disallow all of the "same value" 2-symbol PAM5 sequence values (e.g., $\{0,0\}$, $\{1,1\}$, etc.) so that the recovered 5-ary data has a transition at least once every 3 units. The 5 "same value" 2-symbol PAM5 sequence values can be unmapped, leaving 20 possible PAM5 symbols for mapping.

One may also wish to disallow certain 2-symbol 5-ary sequence values that may be relatively error-prone or power-consuming. For example, when in an analog waveform to be sampled, the 2-symbol 5-ary sequence values $\{2,-2\}$ and $\{-2,2\}$ require relatively large current surges or voltage swings in comparison to other 2-symbol 5-ary sequence values. Similarly, when the information is logarithmically modulated, there may be states or sequence values at one or both ends of the signal value spectrum where the signal value difference approaches the limits of detectability for certain hardware, and one may wish to disallow certain of those states (e.g., every other sequence value from the sequence value corresponding to the maximum signal value) to improve resolution in signal value detection. In any case, eliminating 2 potentially and/or relatively power-consuming or error-prone values leaves 18 available 2-symbol PAM5 sequence values or symbols for mapping. One needs 16 such sequence values/symbols for mapping 4-bit binary data sequence values, leaving 2 sequence values for indicating coding constraint violations (although, in this case, certain "consecutive same value" coding violations have been prohibited by design). Thus, one may use y-unit M-ary overhead to accomplish a number of coding objectives.

Exemplary Software

The present invention also includes algorithms, computer program(s) and/or software, implementable and/or executable in a general purpose computer or workstation equipped with a conventional digital signal processor, configured to perform one or more steps of the present coding method(s) and/or one or more operations of the exemplary hardware described below. Thus, a further aspect of the invention relates to algorithms and/or software that implement the above method(s). For example, the invention may further relate to a computer program, computer-readable medium or waveform containing a set of instructions which, when executed by an appropriate processing device (e.g., a signal processing device, such as a microcontroller, microprocessor or DSP device), is configured to perform one or more of the above-described methods and/or algorithms.

For example, the present invention may relate to a computer program or waveform containing a set of instructions which, when executed by a processing device configured to execute computer-readable instructions, is configured to perform the first exemplary encoding method described above. The exemplary computer program or waveform may further therefore comprise one or more instructions to convert a second one of the second subset of unique x-unit N-ary sequence values into (i) a third member in the second plurality of unique y-unit M-ary sequence values as long as at least one of n preceding y-unit M-ary sequence values in the M-ary sequence differs from the third member, and/or (ii) one of the first and second members in the second plurality of y-unit M-ary sequence values, if none of the n preceding sequence values in the M-ary sequence differ from the third member. Generally, n is a number (e.g., a positive integer) defined at least in part by the coding constraint.

Likewise, the present computer program or waveform may be configured to perform the first exemplary decoding method described above. The exemplary computer program or waveform may further therefore comprise, for example, at least one instruction to convert a member of a third subset containing one or more unique y-unit M-ary sequence values into a predetermined one of the second plurality of x-unit N-ary sequence values.

The present computer program or waveform may also be configured to perform the second exemplary encoding method described above. Thus, the present computer program or waveform may further comprise one or more instructions to map a majority (e.g., more than half, up to a maximum number) of nearest value changes in the y-unit M-ary sequence values to nearest value changes in the x-unit N-ary sequence values. When N is 2, the nearest value changes in the x-unit N-ary sequence values are single bit changes in the binary sequence values.

Likewise, the present computer program or waveform may be configured to perform the second exemplary decoding method described above. The exemplary computer program or waveform may further therefore comprise, for example, at least one instruction to (1) identify an nth previous y-unit M-ary sequence value (n being an integer of at least one), and/or (2) replace an unmapped y-unit M-ary sequence value with a mapped y-unit M-ary sequence value having a value equal to the nth previous y-unit M-ary sequence value.

Alternatively, the computer program or waveform may further comprise at least one instruction to (i) identify each of n previous y-unit M-ary sequence values (n being an integer of at least one), (ii) change (e.g., correct) a most unreliable unit in the n previous y-unit M-ary sequence values if more than one unit in the n previous y-unit M-ary sequence values has a value other than a remaining unit value, and/or (iii) if exactly one unit in the n previous y-unit M-ary sequence values has a value other than the remaining units, change a most unreliable unit in either or both of the unmapped sequence value and in the exactly one unit.

As for either of the exemplary information-encoding methods described above, the computer program or waveform may further comprise at least one instruction to add (1) an even parity indicator to the M-ary sequence when the M-ary information block has an even value and/or (2) an odd parity indicator to the M-ary sequence when the M-ary information block has an odd value. Similarly, for either of the exemplary information-decoding methods described above, the computer program or waveform may further comprise one or more instructions to (A) determine a parity for the M-ary sequence (e.g., determine whether the M-ary sequence has an even value or an odd value), (B) compare the even or odd value with a parity indicator accompanying the M-ary sequence, and/or (C) change one or more least reliable units or sequence values in the M-ary sequence if the transmitted parity indicator does not have a same value as the even or odd value.

The present computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

Exemplary Encoders, Decoders, and Error Checking Circuitry

The present invention also relates to encoders, decoders and error checking and/or error correction circuitry adapted to carry out one or more of the above-described methods. Somewhat surprisingly, each of the exemplary information-encoding methods above can be implemented in essentially the same encoder hardware, and each of the exemplary information-decoding methods above can be implemented in essentially the same decoder hardware, generally with at most minor changes to certain details of the various implementations.

An Exemplary Encoder

In one aspect, the present invention relates to a encoder, comprising: (a) a detector configured to identify each of a plurality of x-unit sequence values of an N-ary sequence; (b) a converter configured to output a y-unit M-ary sequence value corresponding to the x-unit N-ary sequence value; and (c) coding constraint logic configured to (i) determine whether an M-ary sequence output from the converter conforms to a coding constraint for the M-ary sequence and (ii) instruct the converter to output (1) a member of a first subset of y-unit M-ary states uniquely corresponding to the x-unit N-ary sequence value when the M-ary sequence conforms to the coding constraint and (2) a member of a second subset of y-unit M-ary states when the M-ary sequence violates the coding constraint. As for the exemplary encoding methods above, x, N, y and M are generally each an integer of at least 2, $M^y > N^x$, and each of the y-unit M-ary sequence values in the first and second subsets are distinct from one another. In addition, a current member of the second subset of y-unit M-ary sequence values (i.e., the y-unit M-ary sequence value actively being encoded) is generally different from an nth previous member of the second subset of y-unit M-ary sequence values (where n is as described above).

In a first embodiment somewhat related to the first exemplary encoding method described above, the current member of the second subset of y-unit M-ary sequence values is different from an immediately previous member of the second subset of y-unit M-ary sequence values (i.e., n=1). In a second embodiment somewhat related to the second exemplary encoding method described above, the coding constraint logic is configured to instruct the converter to output (1) a first member of the second subset of y-unit M-ary sequence values when at least one of the n previous y-unit M-ary sequence values differs from the first member, and (2) a second member of the second subset of y-unit M-ary sequence values when none of the n previous y-unit M-ary sequence violates values differs from the first member.

Figure 5:
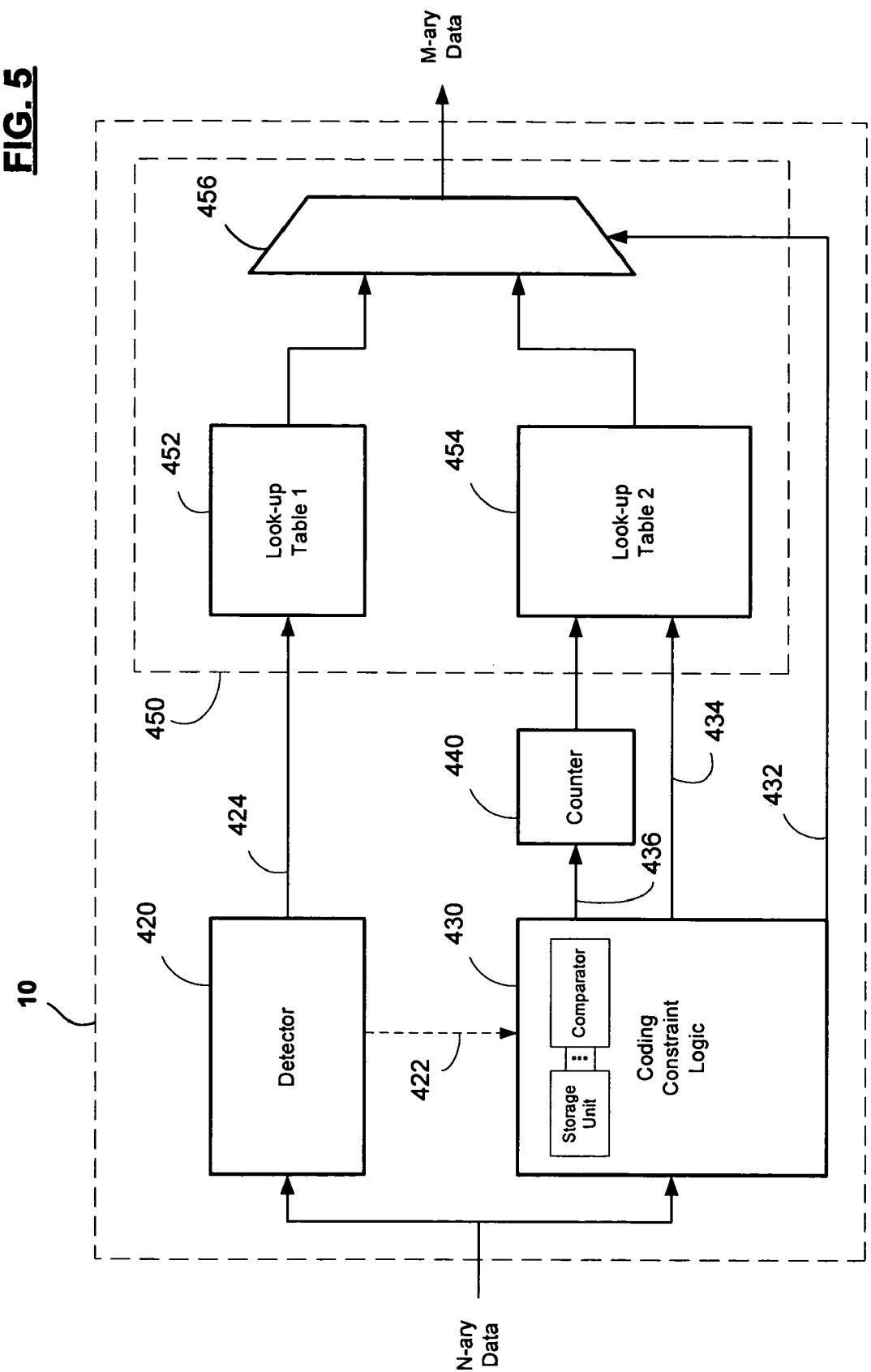
FIG. 5 is a box-level diagram of an exemplary encoder, adapted to practice and/or implement the present invention.

FIG. 5 shows an exemplary encoder 10, including N-ary sequence detector 420, coding constraint logic 430, counter or incrementer 440, and converter 450. Sequence detector 420 receives an N-ary data sequence and is generally configured to determine the identity or sequence value of the x-unit N-ary sequence values to be encoded. Sequence detector 420 may also transmit a signal 422 to converter 450 and/or to coding constraint logic 430 identifying the x-unit N-ary sequence value to be encoded and/or instructing converter 450 and/or to coding constraint logic 430 to perform one or more particular functions based on the sequence value of the x-unit N-ary sequence value to be encoded. It is well within the abilities of one skilled in the art to design and use such detectors.

Coding constraint logic 430 may also receive the N-ary data sequence and/or a signal or instruction from sequence detector 420. Coding constraint logic 430 may be further configured to identify N-ary sequence patterns corresponding to M-ary sequence patterns that may violate one or more coding constraints, and perform particular function(s) in response thereto. Consequently, coding constraint logic 430 may output one or more signals or instructions 432, 434 and/or 436 to other functional blocks configured to encode information such that the M-ary sequence output from converter 450 conforms to the coding constraint(s).

In general, encoder 10 may be adapted to implement either of the two exemplary information encoding methods described above. Thus, in various embodiments, N and/or y may be 2, and x and M may be at least 3 (in one implementation, N and y are each 2, and x and M are each 3). In other embodiments, the coding constraint may comprise a maximum number of consecutive same value units, in which case each of the first plurality of unique y-unit M-ary sequence values may include a transition.

For example, in one aspect of the first exemplary encoding method above, one of the second subset of x-unit N-ary sequence values (e.g., that can potentially cause a coding constraint violation) is converted into one of two members of a second plurality of unique y-unit M-ary sequence values. In such a case, the encoder may further comprise a counter or incrementer 440 configured to select one of the second subset of y-unit M-ary sequence values based on a sequence value of the nth previous member of that second subset, in which case the coding constraint logic may further comprise (i) a memory or storage circuit configured to store the n most recently output (e.g., an immediately previous) member(s) of that second subset and/or (ii) a comparator receiving a multi-bit signal from the memory or storage circuit configured to identify the immediately previous member. It is well within the abilities of one skilled in the art to design and use logic configured to select an output from a plurality of possible outputs based on the previous state(s) or sequence value(s) of that output.

Converter 450 may comprise look-up tables 452 and 454 and selector 456. The first lookup table 452 may store at least the first subset of y-unit M-ary sequence values, and the second lookup table 454 may store the second subset of y-unit M-ary sequence values (e.g., which may, in one embodiment, consist of a current [currently output] member and the immediately previous member, which may be complementary sequence values, and each of which may consist of same value units). The outputs 424 and 434 from detector 420 and coding constraint logic 430, respectively, may select an address in one of look-up tables 452 and 454 for outputting an encoded y-unit M-ary sequence value. Generally, in all embodiments of the present encoder exemplified by FIG. 5, when coding constraint logic 430 instructs look-up table 454 to output a particular y-unit M-ary sequence value (directly or by incrementing counter 440), coding constraint logic 430 also asserts an active signal 432 to multiplexer and/or selector 446 that selects the output of look-up table 454 as the encoded y-unit M-ary sequence value. Otherwise, deassertion (or assertion of an inactive state) of signal 432 generally selects the output of look-up table 452 as the encoded y-unit M-ary sequence value.

In a further embodiment of the encoder adapted for implementing the first exemplary encoding method above, when the detector 420 detects a predetermined x-unit N-ary sequence value (e.g., 000), the coding constraint logic 430 may be further configured to instruct the converter 450 to output (1) a third member of the second subset of y-unit M-ary sequence values (e.g., {0,0}) when at least one of n preceding y-unit M-ary sequence values in the M-ary sequence differs from the third member, n being a number (e.g., a positive integer) defined at least in part by a coding constraint (and which can easily be counted by counter 440), and/or (2) the immediately preceding member of the second subset of y-unit M-ary sequence values if none of the n preceding y-unit M-ary sequence values in the M-ary sequence differ from the third member. Coding constraint logic 430 can be easily adapted to store the n preceding x-unit N-ary sequence values corresponding to the n preceding y-unit M-ary sequence values in the M-ary sequence, and/or compare the corresponding n preceding x-unit N-ary sequence values to the current x-unit N-ary sequence value being encoded to determine whether any of the n preceding y-unit M-ary sequence values differ from the third member. In this embodiment of the present encoder, the second subset of y-unit M-ary sequence values may consist of the current, the immediately preceding and the third members. This exemplary encoder enjoys particular advantage when $N^x > M^y - M$.

On the other hand, in an exemplary encoder adapted to implement the second exemplary information encoding method described above, a majority of nearest value changes in the first subset of y-unit M-ary sequence values may correspond to nearest value changes in the x-unit N-ary sequence values. Thus, in such an encoder where N is 2, a majority (e.g., more than 50%, up to a maximum number) of nearest value changes in the y-unit M-ary sequence values correspond to single-bit changes in the x-bit binary sequence values. Where the coding constraint is a maximum number of consecutive same value units in such an encoder, the maximum number may be defined as (y[n+2])−2, where n is an integer of at least 2 (and which can easily be counted by counter 440).

Either exemplary encoder may further comprise a parity encoder configured to add a parity indicator to the M-ary sequence. In one embodiment consistent with the exemplary parity encoding method described above, the parity indicator has (i) an even value when the M-ary information block has an even value and (ii) an odd value when the M-ary information block has an odd value. The circuit may thus further comprise a calculator configured to determine whether the M-ary information block has the even value or the odd value, and may correlate that even or the odd value to the parity. In one implementation, the parity indicator consists of a parity bit.

However, independent of the exemplary encoders described above, the parity encoding circuit may generally comprise (a) an encoder configured to convert each of a series of x-unit N-ary sequence values into a corresponding series of y-unit M-ary sequence values to form an M-ary sequence, and (b) a parity generator configured to add (i) an even parity indicator to the M-ary sequence when the M-ary information block has an even value and (ii) an odd parity indicator to the M-ary sequence when the M-ary information block has an odd value. As for the other exemplary encoders described above, $M^y>N^x$, M and x may independently be at least 3, and N and y may be 2 (in one embodiment, N is 2, x is 3, M is 3, and y is 2).

An Exemplary Decoder A further aspect of the invention relates to a decoder, comprising (a) a sequence value detector 520 configured to identify each of a plurality of y-unit sequence values of the M-ary sequence, (b) a converter 540 configured to output an x-unit sequence value of an N-ary sequence uniquely corresponding to any one of a first subset of the plurality of y-unit M-ary sequence values, and (c) coding constraint logic 530 configured to (i) store a value for one to n previous y-unit M-ary sequences, n being an integer of at least 1, and (ii) instruct the converter to output one of a plurality of x-unit N-ary sequence values based on the previous y-unit M-ary sequence values (or patterns thereof) when the sequence value detector identifies one of a second subset of unique y-unit M-ary sequence values. As for the other exemplary methods and circuits described herein, x, N, y and M are generally each an integer of at least 2, $M^y>N^x$, the first subset of y-unit M-ary sequence values comprise a plurality of unique sequence values in which each unique sequence value corresponds (or is mapped) to a unique N-ary x-unit sequence value, and each of the unique y-unit M-ary sequence values in the second subset is distinct from the unique sequence values of the first subset. Furthermore, the coding constraint may comprise a maximum number of consecutive same value units.

However, in a first exemplary embodiment of the present decoder somewhat related to the first exemplary decoding method described above, coding constraint logic 530 instructs the converter to output (i) a first one of a plurality of x-unit N-ary sequence values when an immediately previous member of a corresponding second subset of unique y-unit M-ary sequence values has a different value, and (ii) a second one of the plurality of x-unit N-ary sequence values when the immediately previous one of the corresponding plurality of x-unit N-ary sequence values has a same value. In a second exemplary embodiment of the present decoder somewhat related to the second exemplary decoding method described above, coding constraint logic 530 is configured to (i) store an nth previous M-ary sequence value and (ii) instruct said converter to output an x-unit N-ary sequence value corresponding to said nth previous M-ary sequence value when said sequence value detector identifies said one of said second subset of unique y-unit M-ary sequence values. In this second embodiment, the second M-ary subset may consist of one or more unmapped y-unit M-ary sequence values (e.g., corresponding to a coding constraint violation).

Figure 6:
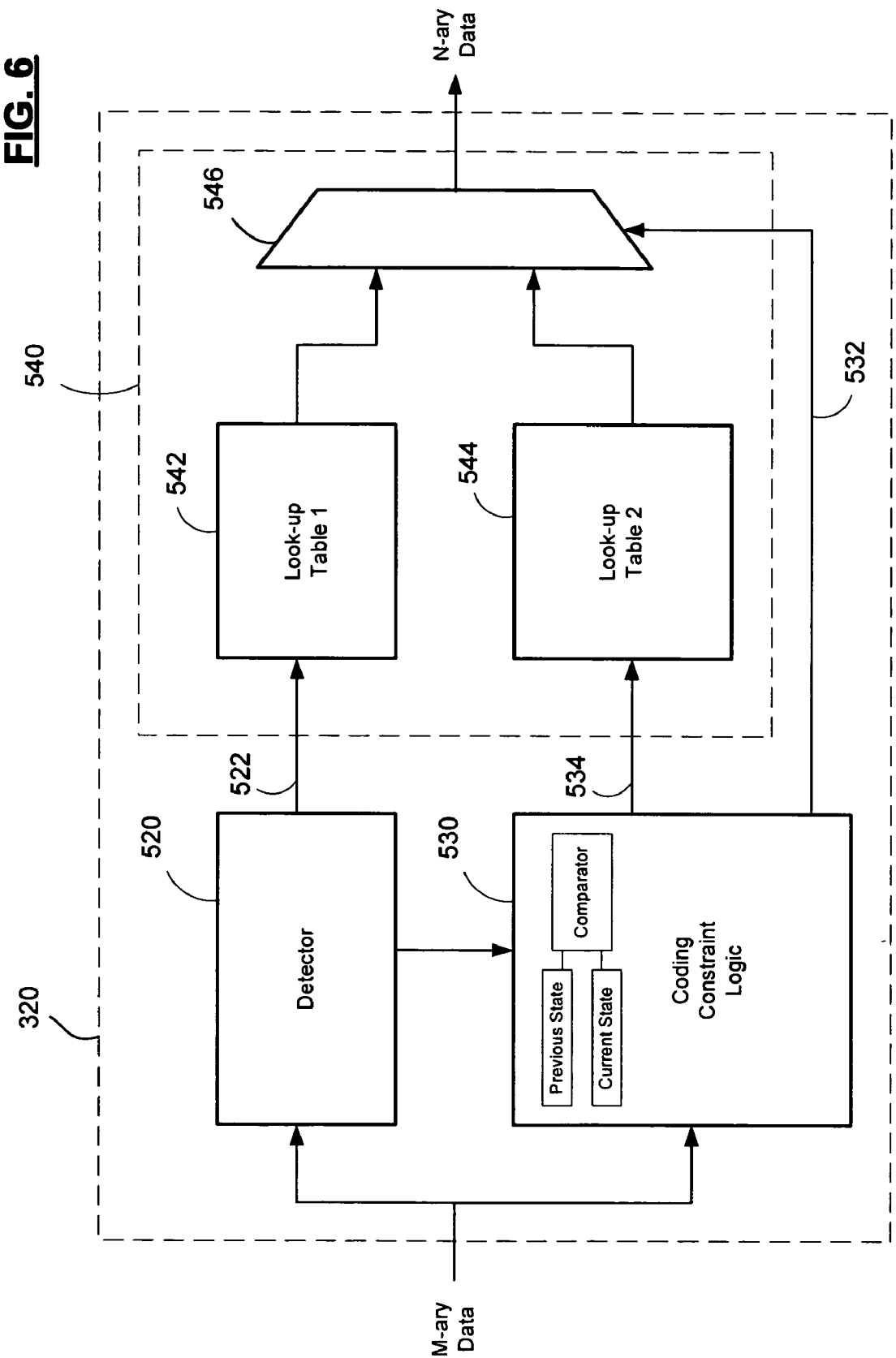
FIG. 6 is a box-level diagram of an exemplary decoder, adapted to practice and/or implement the present invention.

FIG. 6 shows an exemplary decoder 320, including M-ary sequence detector 520, coding constraint logic 530, and converter 540. In general, decoder 320 may be adapted to implement either of the two exemplary information decoding methods described above. Thus, in various embodiments, N and/or y may be 2, and x and M may be at least 3 (in one implementation, N and y are each 2, and x and M are each 3). In other embodiments, the coding constraint may comprise a maximum number of consecutive same value units, in which case each of the first plurality of x-unit N-ary sequence values (e.g., group A1 in FIG. 2) and/or unique y-unit M-ary sequence values (e.g., group X1 in FIG. 2) may include a transition.

Referring back to FIG. 6, sequence detector 520 receives an M-ary data sequence and is generally configured to determine the identity or value of the y-unit M-ary sequences to be decoded. Sequence detector 520 may also transmit a signal or instruction 522 to converter 540 and/or to coding constraint logic 530 identifying the y-unit M-ary sequence to be decoded and/or instructing converter 540 and/or to coding constraint logic 530 to perform one or more particular functions based on the value of the y-unit M-ary sequence to be decoded. It is well within the abilities of one skilled in the art to design and use such sequence or sequence value detectors.

Coding constraint logic 530 may also receive the M-ary data sequence and/or a signal or instruction from sequence detector 520. Coding constraint logic 530 may be further configured to identify M-ary sequence values or patterns corresponding to violations of one or more M-ary coding constraints, and perform particular function(s) in response thereto.

Consequently, coding constraint logic 530 may output one or more signals or instructions 532 and/or 534 to other functional blocks configured to decode information such that the N-ary sequence output from converter 540 is that encoded by the M-ary sequence (subject to transmission and/or reception errors; e.g., routine transmission errors that may have been introduced as a result of channel noise).

The outputs 522 and 534 from detector 520 and coding constraint logic 530, respectively, may select an address in one of look-up tables 542 and 544 for outputting a decoded x-unit N-ary sequence value. Generally, in all embodiments of the present encoder exemplified by FIG. 6, when coding constraint detector 530 instructs look-up table 544 to output a particular x-unit N-ary sequence value, coding constraint logic 530 also asserts an active signal 532 to multiplexer and/or selector 546 that selects the output of look-up table 544 as the decoded x-unit N-ary sequence value. Otherwise, deassertion (or assertion of an inactive state) of signal 532 generally selects the output of look-up table 542 as the decoded x-unit N-ary sequence value.

In one implementation of the first exemplary embodiment of the present decoder, each member of the second subset of unique y-unit M-ary sequence values (e.g., group X2 in FIG. 2) can be converted into only the first or second one of the plurality of x-unit N-ary sequence values (e.g., A2 and A3 in FIG. 2). The coding constraint detector in such an implementation may be further configured to instruct the converter to convert a member of a third subset containing one or more unique y-unit M-ary sequence values (in this case, the sequence value {0,0}, meaning that the second subset of unique y-unit M-ary sequence values is {1,1} and {−1,−1}) into a predetermined one of the plurality of x-unit N-ary sequence values (e.g., 000). Naturally, in such a case, the member(s) of the third subset differs from the members of the first two subsets of y-unit M-ary sequence values (hence, the term "unique"), and the predetermined x-unit N-ary sequence value may be one of the first and second ones of the plurality of x-unit N-ary sequence values. In other implementations, one or both of (i) the first and second ones of the plurality of x-unit N-ary sequence values and (ii) each member of the second subset of y-unit M-ary sequence values may consist of same value units and/or may be complementary to each other. Also, the third subset of y-unit M-ary sequence values may consist of a single member. Such exemplary decoders enjoy particular advantage when $N^x > M^y - M$.

In the second exemplary embodiment of the present decoder, the unmapped y-unit M-ary sequence value may contain a transition (similar to each of the first subset of y-unit M-ary sequence values; e.g., {1,−1} as explained in the second exemplary encoding and decoding methods described above). In such a decoder, when the coding constraint is a maximum number of consecutive same value units, the maximum number is $(y*[n+2])-2$, where n is an integer of at least 2 (and which can be easily recognized by appropriate logic in coding constraint logic 530). When N is 2, a majority of nearest value changes in the y-unit M-ary sequence values may correspond to single-bit changes in the x-bit binary sequence values in the second exemplary decoder.

For example, coding constraint logic 530 may be further configured to identify an nth previous y-unit M-ary sequence value, or each of n previous y-unit M-ary sequence values. In one implementation, the one y-unit M-ary sequence value corresponding to the coding constraint violation has a value equal to the nth previous y-unit M-ary sequence value. In another implementation, the decoder further comprises error correction circuitry, which may be configured to change a most unreliable unit in the n previous y-unit M-ary sequence values if one or more units in the n previous y-unit M-ary sequence values have a value other than a remaining unit value. However, if exactly one unit in the n previous y-unit M-ary sequence values has a value other than the remaining units in the n previous y-unit M-ary sequence values, the error correction circuitry may be further configured to change a most unreliable unit in the unmapped sequence value, in addition to the exactly one unit.

In any exemplary embodiment, the present decoder may further comprise a parity calculator configured to determine a parity for the M-ary sequence. In one embodiment, the parity calculator determines whether the M-ary sequence has an even value or an odd value. The present decoder may also further comprise a comparator configured to compare the parity with a parity indicator accompanying the M-ary sequence (e.g., transmitted with and/or appended to the M-ary sequence). The decoder may further comprise a parity detector (which can be considered part of the parity calculator) configured to identify and/or calculate a parity indicator for the M-ary sequence. The parity calculator may thus calculate a first parity indicator for the M-ary sequence and compare the first parity indicator to a second parity indicator accompanying the M-ary sequence. In one implementation, the first parity indicator (which may consist of a parity bit) has (i) an even value when the M-ary information block has an even value, and (ii) an odd value when the M-ary information block has an odd value. The decoder may also further comprise error correction circuitry configured to change one or more least reliable units in the M-ary sequence if the parity does not have a same value as a parity indicator accompanying the M-ary sequence.

However, independent of the exemplary decoders described above, the decoding circuit may generally comprise (A) a detector configured to determine a value of an M-ary sequence; (B) a parity calculator configured to determine whether a parity indicator for the M-ary sequence is correct based on the value of the M-ary sequence; (C) a converter configured to convert successive y-unit sequence values of the M-ary sequence into corresponding x-unit sequence values of an N-ary sequence; and (D) error correction circuitry configured to correct one or more least reliable M-ary units if the parity indicator is not correct. Similar to the exemplary method of decoding parity-encoded information described above, the information may comprise amplitude modulated information (e.g., pulse amplitude modulated information). As a result, the decoder may further comprise (1) a receiver configured to receive an analog waveform containing the M-ary sequence, (2) a waveform sampler configured to sample the analog waveform, and/or (3) a comparator configured to compare samples from the analog waveform to a plurality of predetermined threshold values.

In one embodiment where M is 3, the plurality of predetermined threshold values may comprise a first threshold value and a second threshold value. Similar to the exemplary parity-encoded information decoding method described above, when the sample has a value greater than the first threshold value, the bit has a value of 1; when the sample has a value less than the second threshold value, the bit has a value of −1; and when the sample has a value between the first and second threshold values, the bit has a value of 0.

The exemplary decoder may, as described above, further comprise a parity calculator configured to determine a parity for the M-ary sequence. The parity calculator may determine whether the M-ary sequence has an even value or an odd value. The decoder may also further comprise (i) a comparator configured to compare the parity with a parity indicator accompanying the M-ary sequence, and/or (ii) error correction circuitry configured to change one or more least reliable units in the M-ary sequence if the parity does not have a same value as a parity indicator accompanying the M-ary sequence.

An Exemplary System

A further aspect of the invention relates to systems comprising one or more aspects of the present invention. For example, the system may be represented by:

A transmitter, comprising (a) the present encoder and (b) a transmitter port communicatively coupled to the encoder, configured to transmit the M-ary sequence to a transmission channel;

A receiver, comprising (1) the present decoder and (2) a receiver port communicatively coupled to the decoder, configured to receive encoded M-ary information from a transmission channel;

A transceiver, comprising either:

The present transmitter and a receiver communicatively coupled to the transmission channel, configured to process encoded information from the transmission channel, or The present receiver and a transmitter communicatively coupled to the channel, configured to provide encoded information to the transmission channel;

A system for transferring data on or across a channel, comprising the present transceiver and either:

At least one receiver port communicatively coupled to the receiver, configured to receive the encoded information from the transmission channel, or At least one transmitter port communicatively coupled to the transmitter for transmitting the encoded information to an external receiver; and A network, comprising a plurality of the present systems, communicatively coupled to each other; and a plurality of storage or communications devices, each of the storage or communications devices being communicatively coupled to one of the systems.

In one embodiment, the system (e.g., the present transceiver) may be embodied on or in a single integrated circuit. For example, the transceiver may be a backplane transceiver, an Ethernet transceiver (e.g., a 10 Gigabit or GbE device), a Fibre Channel transceiver, a serializer-deserializer (SERDES) device, an XAUI transceiver, etc. In further embodiments, the system may be further configured to convert serial data from the network to parallel data for a device, and convert parallel data from the device to serial data for the network. Furthermore, the system may further include (i) an input and/or output transducer, and/or (ii) a modulator and/or demodulator (e.g., when the information to be coded comprises amplitude modulated information). For example, the present transmitter may further comprise a modulator configured to modulate the encoded information and/or transmit the (modulated) encoded information over a channel. Similarly, the present receiver may further comprise a demodulator configured to receive the encoded information from a channel and/or demodulate the (received) encoded information.

Figure 7:
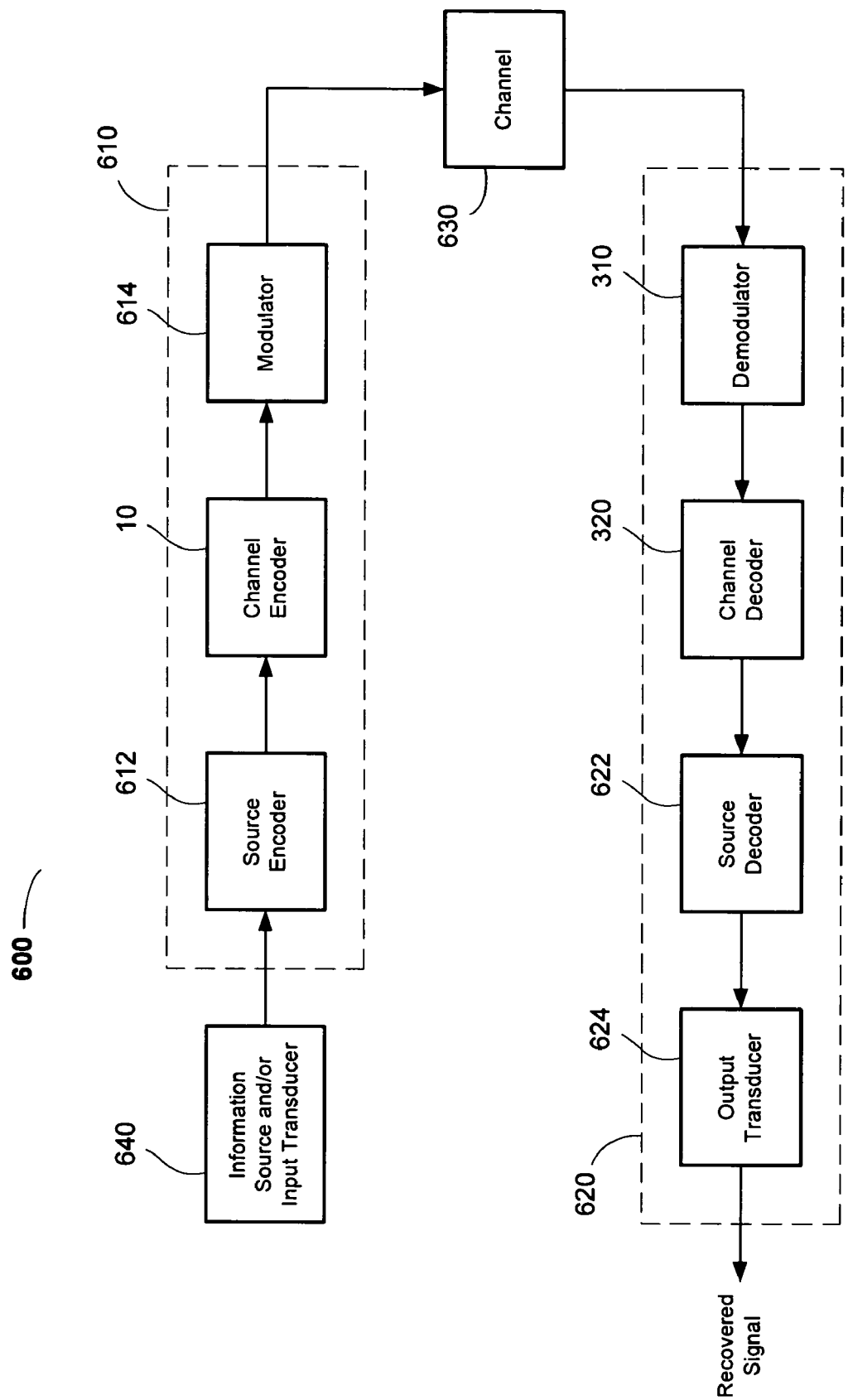
FIG. 7 is a box-level diagram of a communications system for the present invention is suitable.

FIG. 7 shows a diagram of a communications system 600 for which the present invention may be suitable. System 600 comprises transmitter 610, receiver 620 and communications channel 630. Transmitter 610 comprises source encoder 612, channel encoder 10 and modulator 614. Receiver 620 comprises demodulator 310, channel decoder 320, source decoder 622, and output transducer 624. The arrows between the various components of system 600 show the signal flow, originating from information source/input transducer 640, and eventually becoming a signal recovered from transmission channel 630 at the output of output transducer 624. An example of such a system can be found in Proakis, "Digital Communications" (4th ed., 2001, McGraw-Hill), pp. 1–3, the relevant portions of which are incorporated herein by reference.

As suggested by FIG. 7, channel encoder 10 in transmitter 610 can be encoder 10 of FIGS. 1 and 5 (i.e., one of the various exemplary encoders described herein, and which may further include parity encoder 210 of FIG. 3), demodulator 310 in receiver 620 can be threshold detector 310 of FIG. 4, and channel decoder 320 in receiver 620 can be decoder 310 of FIGS. 4 and 6 (i.e., one of the various exemplary decoders described herein). Channel 630 may be any known and/or conventional communications channel (e.g., twisted-pair and/or copper wire[s], traces on printed circuit boards, fiber optic cable, a power line, a standard or predetermined frequency band for transmission through air or a vacuum [e.g., outer space], etc.).

A further aspect of the invention concerns a network, comprising (a) a plurality of the present systems, communicatively coupled to each other; and (b) a plurality of storage or communications devices, wherein each storage or communications device is communicatively coupled to one of the systems. The network may be any kind of known network, such as a storage (e.g., RAID array), Ethernet, wireless, local area, or wide area network.

CONCLUSION/SUMMARY

Thus, the present invention provides a method, software, circuit, architecture, and systems for encoding, decoding and error-checking/correcting information, particularly pulse amplitude modulated information. The present invention enjoys particular advantage when used to encode x-unit sequence values of N-ary information into y-unit sequence values of M-ary information and to decode y-unit sequence values of M-ary information into x-unit sequence values of N-ary information, where $N^x < M^y$ (and particularly where $N^x < M^y$, but $N^x > M^y - M$). The present invention advantageously provides a straight-forward mechanism for coding information that enables one to take advantage of coding overhead (e.g., unused states in the encoded, transmitted sequence) to accomplish other coding objectives, such as conforming to coding constraints, reducing transmission errors (or increasing the likelihood of successfully correcting such errors), dc balancing the coded information, and under certain conditions, even reducing power consumption.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An encoder, comprising:
   a) a detector configured to identify each of a plurality of x-unit sequence values of an N-ary sequence, where x and N are each an integer of at least 2;
   b) a converter configured to convert each of said x-unit N-ary sequence values to a y-unit M-ary sequence value, where y and M are each an integer of at least 2 and $M^y > N^x$;
   c) coding constraint logic configured to (i) determine whether an M-ary sequence output from said converter conforms to a coding constraint for said M-ary sequence and (ii) instruct said converter to output (1) a member of a first subset of y-unit M-ary sequence values when said M-ary sequence conforms to said coding constraint and (2) a member of a second subset of y-unit M-ary sequence values when said M-ary sequence violates said coding constraint, each of said y-unit M-ary sequence values in said second subset being distinct from said y-unit M-ary sequence values in said first subset.

2. The encoder of claim 1, wherein said converter comprises a first lookup table storing at least said first subset of y-unit M-ary sequence values.

3. The encoder of claim 2, wherein said converter further comprises a second lookup table storing said second subset of y-unit M-ary sequence values.

4. The encoder of claim 3, further comprising a multiplexer and/or selector configured to receive a signal from said coding constraint logic and select an output from said first lookup table when said M-ary sequence conforms to said coding constraint and from said second lookup table when said M-ary sequence violates said coding constraint.

5. The encoder of claim 1, further comprising a counter or incrementer configured to select one of said second subset of y-unit M-ary sequence values based on a value of an nth previous member of said second subset of y-unit M-ary sequence values, said nth previous member being different from a current member of said second subset of y-unit M-ary sequence values, and n being an integer of at least 1.

6. The encoder of claim 5, wherein said coding constraint logic comprises a memory or storage circuit configured to store the n previous member(s) of said second subset of y-unit M-ary sequence values.

7. The encoder of claim 6, wherein said coding constraint logic comprises a comparator configured to (i) receive a signal from the memory or storage circuit and (ii) identify the immediately previous member.

8. The encoder of claim 1, wherein each of said first subset of y-unit M-ary sequence values includes a transition.

9. The encoder of claim 1, wherein said coding constraint comprises a maximum number of consecutive same value units.

10. The encoder of claim 1, wherein N is 2, M is 3, x is 3, and y is 2.

11. A transmitter, comprising:
a) the encoder of claim 1; and
b) a modulator configured to transmit said M-ary sequence to a channel.

12. The transmitter of claim 1, further comprising a source encoder configured to receive a signal from an information source and/or input transducer, and provide said plurality of x-unit N-ary sequence values.

13. A transceiver, comprising:
a) the transmitter of claim 11; and
b) a receiver communicatively coupled to said channel, configured to process encoded information from said channel.

14. The transceiver of claim 13, wherein said receiver comprises a demodulator configured to receive said M-ary sequence from said channel.

15. The transceiver of claim 14, further comprising a decoder configured to decode said M-ary sequence.

16. The transceiver of claim 15, further comprising an output transducer configured to recover a signal from said decoded M-ary sequence.

17. A decoder, comprising:
a) a detector configured to identify a value of each of a plurality of y-unit M-ary sequences, where y and M are each an integer of at least 2;
b) a converter configured to convert said y-unit M-ary sequences to an x-unit N-ary sequence, where x and N are each an integer of at least 2, $M^y > N^x$; and
c) coding constraint logic configured to (i) store a value for one to n previous y-unit M-ary sequences, n being an integer of at least 1, and (ii) instruct said converter to output one of a subset of x-unit N-ary sequence values based on said previous y-unit M-ary sequence value(s) when said detector identifies one of a subset of said y-unit M-ary sequence values.

18. The decoder of claim 17, wherein each member of said subset of y-unit M-ary sequence values consists of same value units.

19. The decoder of claim 17, wherein said coding constraint logic comprises a comparator configured to compare a current value of said one of said subset of y-unit M-ary sequence values to a value of a previous member of said subset of y-unit M-ary sequence values.

20. The decoder of claim 19, wherein said coding constraint logic is further configured to instruct said converter to output (1) a first one of said subset of x-unit N-ary sequence values if said current value differs from said value of said previous member and (2) a second one of said subset of x-unit N-ary sequence values if said current value equals said value of said previous member.

21. The decoder of claim 17, wherein said coding constraint logic is configured to (i) store an nth previous M-ary sequence value and (ii) instruct said converter to output an x-unit N-ary sequence value corresponding to said nth previous M-ary sequence value when said detector identifies said one of said subset of y-unit M-ary sequence values.

22. The decoder of claim 17, wherein N is 2, M is 3, x is 3, and y is 2.

23. The decoder of claim 17, wherein each of said y-unit M-ary sequence values other than said subset of y-unit M-ary sequence values includes a transition.

24. The decoder of claim 17, wherein said converter comprises a first look-up table configured to output said one of said subset of x-unit N-ary sequence values when said detector identifies said one of said subset of y-unit M-ary sequence values.

25. The decoder of claim 24, wherein said converter further comprises a second look-up table configured to output an x-unit N-ary sequence value other than one of said subset of x-unit N-ary sequence values when said detector identifies a y-unit M-ary sequence value other than one of said subset of y-unit M-ary sequence values.

26. The decoder of claim 25, further comprising further comprising a multiplexer and/or selector configured to receive a signal from said coding constraint logic and select an output from said second lookup table when said one of said subset of y-unit M-ary sequence values is identified and from said first lookup table when said y-unit M-ary sequence value other than one of said subset of y-unit M-ary sequence values is identified.

27. A receiver, comprising:
a) the decoder of claim 17; and
b) a demodulator communicatively coupled to said decoder, configured to receive encoded M-ary information from a channel.

28. The receiver of claim 27, further comprising a source decoder configured to decode said x-unit N-ary sequence values.

29. The receiver of claim 28, further comprising an output transducer configured to recover a signal from said decoded N-ary sequence.

30. A transceiver, comprising:
a) the receiver of claim 27; and
b) a transmitter communicatively coupled to said channel, configured to provide encoded information to said channel.

31. The transceiver of claim 30, wherein said transmitter comprises a modulator configured to transmit said M-ary sequence to said channel.

32. The transceiver of claim 31, further comprising an encoder configured to receive a signal from an information source and/or input transducer, and provide said plurality of y-unit M-ary sequence values.

* * * * *